US009761792B2

(12) United States Patent
Hwang et al.

(10) Patent No.: US 9,761,792 B2
(45) Date of Patent: Sep. 12, 2017

(54) MAGNETIC RANDOM ACCESS MEMORY DEVICES AND METHODS OF MANUFACTURING THE SAME

(71) Applicants: Kyu-Man Hwang, Hwaseong-si (KR); Shi-Jung Kim, Yongin-si (KR); Mi-Lim Park, Suwon-si (KR); Jun-Soo Bae, Hwaseong-si (KR); Seung-Woo Lee, Busan (KR)

(72) Inventors: Kyu-Man Hwang, Hwaseong-si (KR); Shi-Jung Kim, Yongin-si (KR); Mi-Lim Park, Suwon-si (KR); Jun-Soo Bae, Hwaseong-si (KR); Seung-Woo Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/887,506

(22) Filed: Oct. 20, 2015

(65) Prior Publication Data

US 2016/0155934 A1   Jun. 2, 2016

(30) Foreign Application Priority Data

Nov. 27, 2014   (KR) .................. 10-2014-0167003

(51) Int. Cl.
*H01L 27/22*   (2006.01)
*H01L 43/08*   (2006.01)
*H01L 43/12*   (2006.01)

(52) U.S. Cl.
CPC .............. *H01L 43/08* (2013.01); *H01L 43/12* (2013.01)

(58) Field of Classification Search
CPC ........ H01L 27/228; H01L 43/08; H01L 43/12
See application file for complete search history.

(56) References Cited

U.S. PATENT DOCUMENTS

| 2005/0146927 | A1  | 7/2005  | Costrini |
| 2006/0234445 | A1  | 10/2006 | Yang |
| 2008/0265347 | A1* | 10/2008 | Iwayama ............... H01L 43/08 257/421 |
| 2009/0159563 | A1  | 6/2009  | Jung |
| 2011/0235217 | A1  | 9/2011  | Chen et al. |
| 2013/0001652 | A1  | 1/2013  | Yoshikawa et al. |
| 2013/0034917 | A1  | 2/2013  | Lee |

(Continued)

FOREIGN PATENT DOCUMENTS

| JP | 2005340260 A  | 12/2005 |
| JP | 2008-218829 A | 9/2008  |

(Continued)

*Primary Examiner* — Whitney T Moore
*Assistant Examiner* — Joseph Galvin, III
(74) *Attorney, Agent, or Firm* — Harness, Dickey & Pierce P.L.C.

(57) ABSTRACT

Magnetic random access memory (MRAM) devices, and methods of manufacturing the same, include at least one first magnetic material pattern on a substrate, at least one second magnetic material pattern on the at least one first magnetic material pattern, and at least one tunnel barrier layer pattern between the at least one first magnetic material pattern and the at least one second magnetic material pattern. A width of a top surface of the at least one first magnetic material pattern may be less than a width of a bottom surface of the at least one second magnetic material pattern.

8 Claims, 19 Drawing Sheets

(56) References Cited

U.S. PATENT DOCUMENTS

2014/0021566 A1 1/2014 Park et al.
2014/0022839 A1 1/2014 Park et al.
2014/0170776 A1 6/2014 Satoh et al.

FOREIGN PATENT DOCUMENTS

| | | |
|---|---|---|
| JP | 5039317 B2 | 10/2012 |
| JP | 2013-016587 A | 1/2013 |
| KR | 100943860 B1 | 2/2010 |
| KR | 2013-0015564 A | 2/2013 |
| KR | 2014-0012419 A | 2/2014 |
| KR | 101390382 B1 | 4/2014 |

\* cited by examiner

MAGNETIC RANDOM ACCESS MEMORY DEVICES AND METHODS OF MANUFACTURING THE SAME

CROSS-REFERENCE TO RELATED APPLICATION

This application claims priority to, and the benefit of, under 35 USC §119, Korean Patent Application No. 10-2014-0167003, filed on Nov. 27, 2014 in the Korean Intellectual Property Office (KIPO), the contents of which are herein incorporated by reference in their entirety.

BACKGROUND

1. Field

Example embodiments relate to magnetic random access memory (MRAM) devices and methods of manufacturing the same. More particularly, example embodiments relate to MRAM devices having a magnetic tunnel junction (MTJ) structure containing a magnetic material and methods of manufacturing the same.

2. Description of the Related Art

An MRAM device is a memory device that stores data using a change of resistance in an MTJ structure. The MRAM device may have a high operation speed and a good structural stability. Thus, the MRAM device is spotlighted as a next generation non-volatile memory device.

However, according to the high integration degree of the MRAM device, a gap between memory cells or the MTJ structures may be reduced. Additionally, materials of the MTJ structure may not be easily etched. Therefore, it is not easy to secure the reliability of the MTJ structure.

SUMMARY

Example embodiments relate to magnetic random access memory (MRAM) devices and methods of manufacturing the same. More particularly, example embodiments relate to MRAM devices having a magnetic tunnel junction (MTJ) structure containing a magnetic material and methods of manufacturing the same.

Example embodiments provide a magnetic random access memory (MRAM) device having a good electrical and mechanical reliability.

Example embodiments provide a method of manufacturing an MRAM device having a good electrical and mechanical reliability.

According to example embodiments, an MRAM device includes at least one first magnetic material pattern on a substrate, at least one second magnetic material pattern on the at least one first magnetic material pattern, and at least one tunnel barrier layer pattern between the at least one first magnetic material pattern and the at least one second magnetic material pattern. A width of a top surface of the at least one first magnetic material pattern may be less than a width of a bottom surface of the at least one second magnetic material pattern.

In example embodiments, a width of the at least one tunnel barrier layer pattern may gradually increase from a bottommost portion toward a topmost portion thereof.

In example embodiments, a width of a bottom surface of the at least one tunnel barrier layer pattern may be greater than the width of the top surface of the at least one second magnetic material pattern.

In example embodiments, a width of a top surface of the at least one tunnel barrier layer pattern may be less than the width of the bottom surface of the at least one second magnetic material pattern.

In example embodiments, a width of the at least one first magnetic material pattern may gradually decrease from a bottommost portion toward a topmost portion thereof, and a width of the at least one second magnetic material pattern may gradually decrease from a bottommost portion toward a topmost portion thereof.

In example embodiments, the MRAM device may further include a lower electrode electrically connected to the at least one first magnetic material pattern, an upper electrode electrically connected to the at least one second magnetic material pattern, and a switching element electrically connected to the lower electrode.

In example embodiments, the tunnel barrier layer pattern may include aluminum oxide, and/or magnesium oxide.

In example embodiments, the MRAM device may further include a conductive pattern between the upper electrode and the at least one second magnetic material pattern.

In example embodiments, the conductive pattern may include at least one selected from aluminum oxide, and magnesium oxide. The conductive pattern may have a resistivity lower than a resistivity of the tunnel barrier layer pattern. A thickness of the conductive pattern may be less than half of a thickness of the at least one tunnel barrier layer pattern.

According to example embodiments, there is provided a method of manufacturing an MRAM device. In the method, at least one first magnetic material layer, at least one tunnel barrier layer, and at least one second magnetic material layer are stacked sequentially on a substrate. The at least one second magnetic material layer is partially removed by performing a first etching process to form at least one second magnetic material pattern. A sacrificial layer covering the at least one second magnetic material pattern and the at least one tunnel barrier layer is formed. The sacrificial layer is partially removed by performing a second etching process to form a sacrificial layer pattern covering a sidewall of the at least one second magnetic material pattern. The at least one tunnel barrier layer and the at least one first magnetic material layer are partially removed by performing a third etching process to form at least one tunnel barrier layer pattern and at least one first magnetic material pattern.

In example embodiments, the performing the second etching process and the performing the third etching process may occur simultaneously.

In example embodiments, each of the performing the first, second, and third etching processes may include performing an ion beam etching process.

In example embodiments, when the second etching process is performed, ions may be accelerated in a first direction substantially perpendicular to a top surface of the substrate. When the third etching process is performed, ions may be accelerated in a second direction, the second direction being inclined with respect to the first direction.

In example embodiments, when the first etching process is performed, the at least one tunnel barrier layer may be partially removed to form at least one preliminary tunnel barrier layer pattern. An upper portion of the at least one preliminary tunnel barrier layer pattern may have a sidewall continuous with the sidewall of the at least one second magnetic material pattern. A lower portion of the at least one preliminary tunnel barrier layer pattern may have a second sidewall, the second sidewall having a slope smaller than a slope of the first sidewall of the upper portion of the at least one preliminary tunnel barrier layer pattern.

In example embodiments, the performing the second etching process to form the at least one sacrificial layer pattern may include covering the upper sidewall of the at least one preliminary tunnel barrier layer pattern. When the third etching process is performed, the lower portion of the at least one preliminary tunnel barrier pattern and the at least one first magnetic material pattern may be partially removed.

In example embodiments, when the third etching process is performed, the sacrificial layer pattern may be removed.

In example embodiments, the sacrificial layer may have an etching rate lower than an etching rate of the at least one first magnetic material layer during the second and third etching processes.

In example embodiments, the sacrificial layer may include at least one selected from magnesium oxide and aluminum oxide.

In example embodiments, the first magnetic material layer may include cobalt-iron-boron alloy.

According to example embodiments, there is provided a method of manufacturing an MRAM device. In the method, at least one first magnetic material layer, at least one tunnel barrier layer, and at least one second magnetic material layer are stacked sequentially on a substrate. The at least one second magnetic material layer and the at least one tunnel barrier layer are partially removed by performing a first etching process to form at least one second magnetic material pattern and at least one tunnel barrier layer pattern, respectively. A sacrificial layer covering the at least one second magnetic material pattern, the at least one tunnel barrier layer pattern, and the at least one first magnetic material layer is formed. The sacrificial layer is partially removed by performing a second etching process to form a sacrificial layer pattern covering a sidewall of the at least one second magnetic material pattern and a sidewall of the at least one tunnel barrier layer pattern. The at least one first magnetic material layer is partially removed by performing a third etching process to form at least one first magnetic material pattern.

According to example embodiments, a method of manufacturing an MRAM device, includes providing at least one first magnetic material pattern and at least one magnetic material layer with at least one tunnel barrier layer interposed between the at least one first magnetic material pattern and the at least one magnetic material layer; forming a sacrificial layer pattern covering sidewalls of the at least one first magnetic material pattern; and partially removing the at least one tunnel barrier layer and the at least one magnetic material layer to form at least one tunnel barrier layer pattern and at least one second magnetic material pattern, respectively.

The forming the sacrificial layer pattern may include forming a sacrificial layer, and the sacrificial layer either (i) at least partially covers sidewalls of the at least one tunnel barrier layer, or (ii) contacts an upper surface of the at least one tunnel barrier layer.

The partially removing the at least one tunnel barrier layer and the at least one magnetic material layer may include performing an etching process using the sacrificial layer pattern as an etching mask.

The partially removing the at least one tunnel barrier layer may include partially removing the at least one first magnetic material pattern to form at least one third magnetic material pattern. The at least one third magnetic material pattern may have first sidewalls extending in a first direction, and second sidewalls extending in a second direction, the second direction opposing the first direction.

The partially removing the at least one tunnel barrier layer may include forming first sidewalls in the at least one tunnel barrier layer pattern extending in a first direction, and forming second sidewalls in the at least one tunnel barrier layer pattern extending in a second direction, the second direction opposing the first direction.

BRIEF DESCRIPTION OF THE DRAWINGS

Example embodiments will be more clearly understood from the following detailed description taken in conjunction with the accompanying drawings.

FIG. 1 is a cross-sectional view illustrating a magnetic tunnel junction (MTJ) structure in accordance with example embodiments;

FIG. 2 is a cross-sectional view illustrating an MTJ structure in accordance with example embodiments;

FIG. 3 is a cross-sectional view illustrating an MTJ structure in accordance with example embodiments;

FIGS. 4 to 9 are cross-sectional views illustrating stages of a method of manufacturing an MTJ structure in accordance with example embodiments;

FIGS. 10 to 13 are cross-sectional views illustrating stages of a method of manufacturing an MTJ structure in accordance with example embodiments;

FIGS. 14 to 16 are cross-sectional views illustrating stages of a method of manufacturing an MTJ structure in accordance with example embodiments;

FIGS. 17 to 26 are cross-sectional views illustrating stages of a method of manufacturing an MRAM device in accordance with example embodiments; and FIG. 27 is a block diagram illustrating a schematic configuration of an information processing system in accordance with example embodiments.

DESCRIPTION OF EXAMPLE EMBODIMENTS

Figure 1:
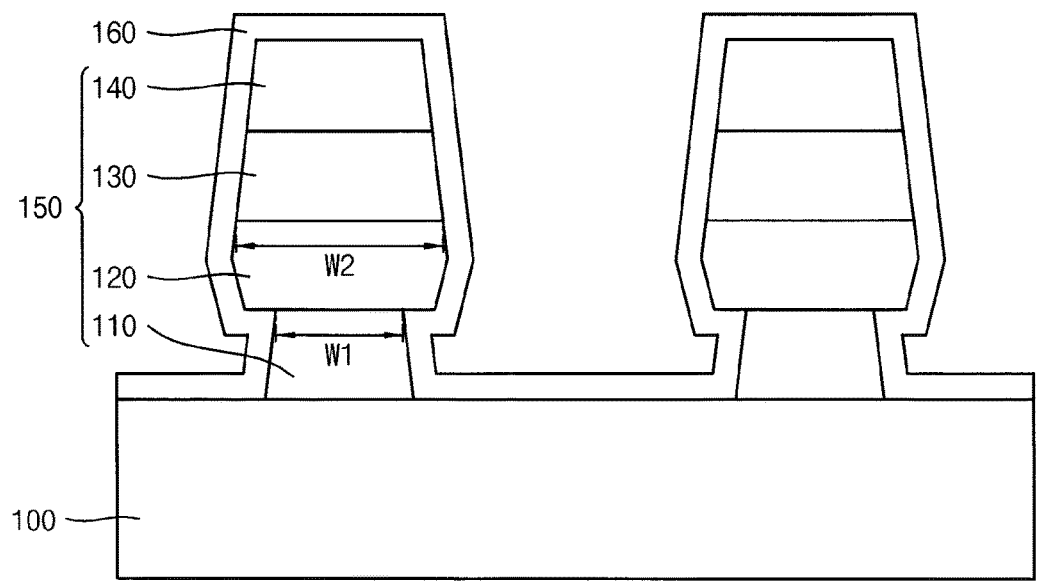
FIGS. 1 to 27 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments relate to magnetic random access memory (MRAM) devices and methods of manufacturing the same. More particularly, example embodiments relate to MRAM devices having a magnetic tunnel junction (MTJ) structure containing a magnetic material and methods of manufacturing the same.

FIG. 1 is a cross-sectional view illustrating a magnetic tunnel junction (MTJ) structure in accordance with example embodiments.

Referring to FIG. 1, an MTJ structure 150 may include a first magnetic material pattern 110, a tunnel barrier layer pattern 120, a second magnetic material pattern 130, and a conductive pattern 140 sequentially stacked on a substrate 100.

The first magnetic material pattern 110 may be disposed on the substrate 100. In example embodiments, the first magnetic material pattern 110 may be electrically connected to a lower electrode (not shown) on the substrate 100.

In example embodiments, the first magnetic material pattern 110 may serve as a fixed layer having a fixed magnetization direction. The first magnetic material pattern 110 may include, e.g., ferro-manganese (FeMn), iridium-manganese (IrMn), platinum-manganese (PtMn), manganese oxide (MnO), manganese sulfide (MnS), manganese telluride (MnTe), manganese fluoride ($MnF_2$), ferrous fluoride ($FeF_2$), ferrous chloride ($FeCl_2$), ferrous oxide (FeO), cobalt chloride ($CoCl_2$), cobalt oxide (CoO), nickel chloride ($NiCl_2$), nickel oxide (NiO), or the like. These materials may be used alone or in a combination thereof.

In example embodiments, the first magnetic material pattern 110 may be formed by forming a first magnetic material layer and partially etching the first magnetic material layer. According to the characteristics of the etching process, a width of the first magnetic material pattern 110 may decrease from a bottom (or bottommost) portion toward a top (or topmost) portion thereof. A width of a top surface of the first magnetic material pattern 110 may be defined as a first width W1.

The second magnetic material pattern 130 may be disposed on the first magnetic material pattern 110. In example embodiments, the second magnetic material pattern 130 may be electrically connected to an upper electrode (not shown).

In example embodiments, the second magnetic material pattern 130 may be formed by forming a second magnetic material layer and partially etching the second magnetic material layer. According to the characteristics of the etching process, a width of the second magnetic material pattern 130 may decrease from a bottom (or, bottommost) portion toward a top (or topmost) portion thereof. A width of a bottom surface of the second magnetic material pattern 130 may be defined as a second width W2. In example embodiments, the second width W2 may be greater than the first width W1.

In example embodiments, the second magnetic material pattern 130 may serve as a free layer having a variable magnetization direction. In this case, the second magnetic material pattern 130 may include a ferromagnetic material, e.g., iron (Fe), cobalt (Co), nickel (Ni), chrome (Cr), platinum (Pt), or the like. The second magnetic material pattern 130 may further include boron or silicon. These materials may be used alone or in a combination thereof. The second magnetic material pattern 130 may include an alloy, e.g., CoFe, NiFe, FeCr, CoFeNi, PtCr, CoCrPt, CoFeB, NiFeSiB, CoFeSiB, or the like.

The tunnel barrier layer pattern 120 may be disposed between the first magnetic material pattern 110 and the second magnetic material pattern 130. Thus, the first and second magnetic material patterns 110 and 130 may not directly contact each other.

In example embodiments, the tunnel barrier layer pattern 120 may include a metal oxide having an insulating property, e.g., magnesium oxide ($MgO_x$), aluminum oxide ($AlO_x$), or the like. The tunnel barrier layer pattern 120 may provide an insulating tunnel barrier in which quantum-mechanical tunneling may occur between the first and second magnetic material patterns 110 and 130.

The tunnel barrier layer pattern 120 may be formed by forming a tunnel barrier layer and partially etching the tunnel barrier layer. In example embodiments, the tunnel barrier layer may be etched in an etching process for forming the first magnetic material pattern 110. Additionally, a lower portion of the tunnel barrier layer may be etched in an etching process for forming the second magnetic material pattern 130. Accordingly, a central portion of the tunnel barrier layer pattern 120 may have a width greater than those of an upper (or uppermost) portion and a lower (or lowermost) portion thereof.

In example embodiments, the width of each of the first and second magnetic material patterns 110 and 130 may gradually decrease from the bottom portion toward the top portion thereof. That is, each of sidewalls of the first and second magnetic material patterns 110 and 130 may have a positive slope. However, the first width W1 of the top surface of the first magnetic material pattern 110 may be less than the second width W2 of the bottom surface of the second magnetic material pattern 130. Thus, the tunnel barrier layer pattern 120 may include a portion having a width gradually increasing from a bottom (or bottommost) portion toward a top portion thereof. That is, a portion of a sidewall of the tunnel barrier layer pattern 120 may have a negative slope or a reverse inclination.

In example embodiments, each of the first magnetic material pattern 110, the tunnel barrier layer pattern 120, and the second magnetic material layer pattern 130 may be formed by an ion beam etching process. When the ion beam etching process is performed, ions accelerated by an electric field may collide with an etching target layer to remove the etching target layer. However, a re-deposition phenomenon may occur during the ion beam etching process. That is, a material of the etching target layer, which is required to be removed by the collision with the ions, may be deposited again on a sidewall of the tunnel barrier layer pattern 120. If the re-deposition phenomenon occurs, a short circuit may occur between the first magnetic material pattern 110 and the second magnetic material pattern 130 so as to cause problems in the reliability of the MTJ structure. The re-deposition phenomenon may occur actively on a portion of a sidewall having a positive slope, while the re-deposition phenomenon may not occur, or may occur less frequently, on a portion of the sidewall having a negative slope. The portion of the sidewall of the tunnel barrier layer pattern 120 may have the negative slope, thereby preventing the short circuit between the first magnetic material pattern 110 and the second magnetic material pattern 130 due to the re-deposition phenomenon.

The conductive pattern 140 may be disposed on the second magnetic material pattern 130. In example embodiments, the conductive pattern 140 may have a single layer structure or a multi-layered structure. The conductive pattern 140 may reduce a contact resistance between the second magnetic material pattern 130 and the upper electrode (not shown), and may serve as a barrier layer for preventing the diffusion of the second magnetic material pattern 130.

A spacer layer 160 may be disposed on sidewalls of the first magnetic material pattern 110, the tunnel barrier layer pattern 120, the second magnetic material pattern 130, and the conductive pattern 140, and/or a top surface of the conductive pattern 140. The spacer layer 160 may protect the first magnetic material pattern 110, the tunnel barrier layer pattern 120, the second magnetic material pattern 130, and the conductive pattern 140 from oxygen and/or moisture.

The MTJ structure 150 having the free layer disposed above the fixed layer has been illustrated, however, example embodiments of the present inventive concepts are not be limited thereto. For example, the free layer may be disposed under the fixed layer.

Figure 2:
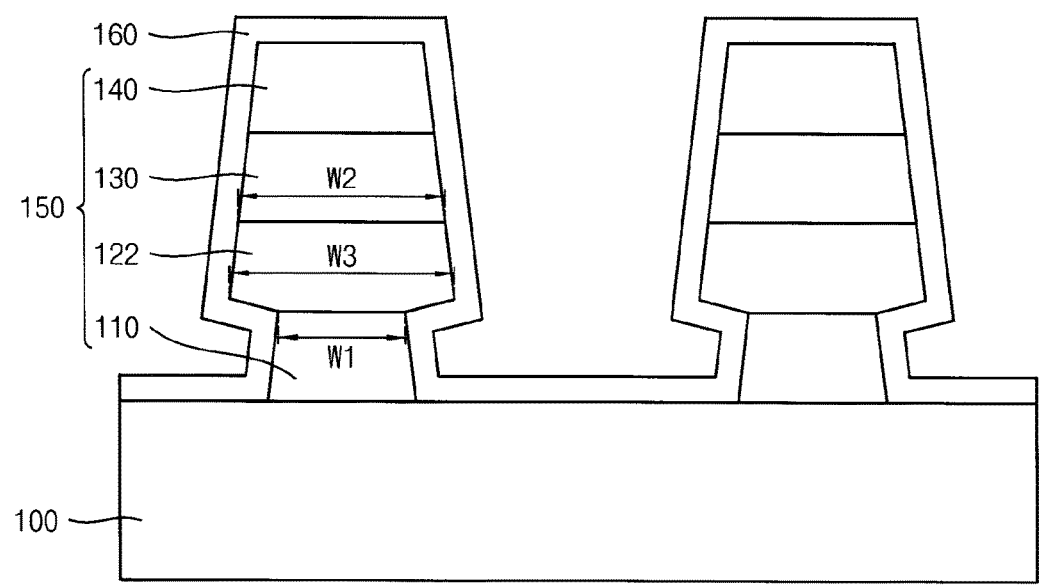

FIG. 2 is a cross-sectional view illustrating an MTJ structure in accordance with example embodiments.

The MTJ structure in FIG. 2 may be substantially the same as or similar to that illustrated with reference to FIG. 1 except for the tunnel barrier layer pattern 122. Thus, like reference numerals refer to like elements, and detailed descriptions thereon may be omitted below in the interest of brevity.

Referring to FIG. 2, a MTJ structure 150 may include the first magnetic material pattern 110, a tunnel barrier layer pattern 122, the second magnetic material pattern 130, and the conductive pattern 140 sequentially stacked on the substrate 100.

The first magnetic material pattern 110 may be disposed on the substrate 100, and the width of the first magnetic material pattern 110 may decrease from the bottom portion toward the top portion thereof. The width of the top surface of the first magnetic material pattern 110 may be the first width W1.

The second magnetic material pattern 130 may be disposed above the first magnetic material pattern 110, and the width of the second magnetic material pattern 130 may decrease from the bottom portion toward the top portion thereof. The width of the bottom surface of the second magnetic material pattern 130 may be the second width W2 greater than the first width W1.

The tunnel barrier layer pattern 122 may be disposed between the first magnetic material pattern 110 and the second magnetic material pattern 130, and a width of the tunnel barrier layer pattern 122 may become decrease from a bottom portion toward a top portion thereof. That is, a sidewall of the tunnel barrier layer pattern 122 may have a positive slope.

However, in example embodiments, a width of a bottom surface of the tunnel barrier layer pattern 122 may be defined as a third width W3 greater than the first width W1 of the top surface of the first magnetic material pattern 110. Accordingly, the re-deposition phenomenon may not occur, or may occur less frequently, on the bottom surface of the tunnel barrier layer pattern 122 not covered by the first magnetic material pattern 110 during the ion beam etching process, thereby preventing the short circuit between the first magnetic material pattern 110 and the second magnetic material pattern 130.

Figure 3:
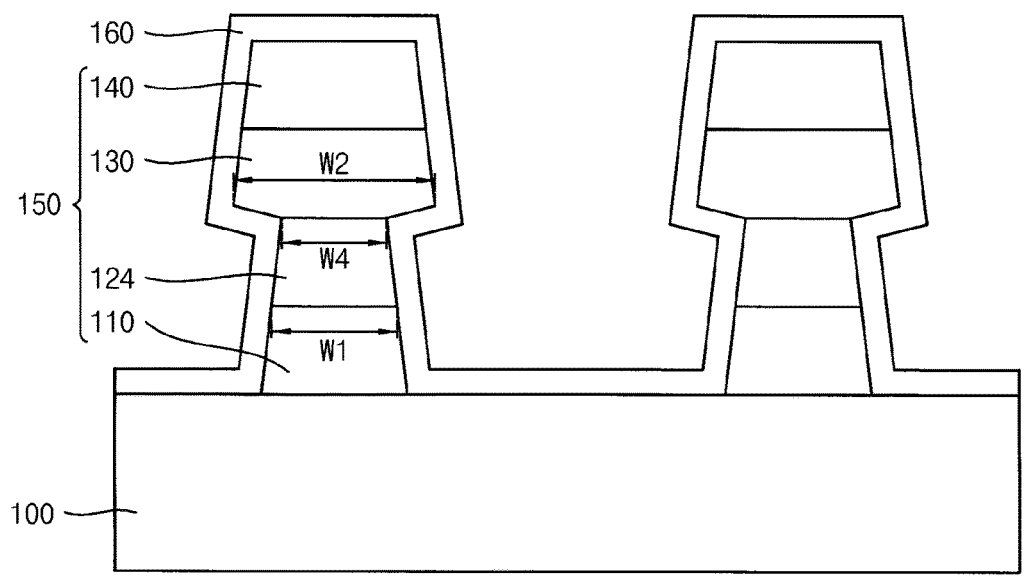

FIG. 3 is a cross-sectional view illustrating an MTJ structure in accordance with example embodiments.

The MTJ structure in FIG. 3 may be substantially the same as or similar to that illustrated with reference to FIG. 1, except for the tunnel barrier layer pattern. Thus, like reference numerals refer to like elements, and detailed descriptions thereon may be omitted below in the interest of brevity.

Referring to FIG. 3, a MTJ structure 150 may include the first magnetic material pattern 110, a tunnel barrier layer pattern 124, the second magnetic material pattern 130, and the conductive pattern 140 sequentially stacked on the substrate 100.

The tunnel barrier layer pattern 124 may be disposed between the first magnetic material pattern 110 and the second magnetic material pattern 130, and a width of the tunnel barrier layer pattern 124 may decrease from a bottom portion toward a top portion thereof. That is, a sidewall of the tunnel barrier layer pattern 124 may have a positive slope.

In example embodiments, a width of a top surface of the tunnel barrier layer pattern 124 may be defined as a fourth width W4 less than the second width W2 of the bottom surface of the second magnetic material pattern 130. Accordingly, the re-deposition phenomenon may not occur, or may occur less frequently, on the bottom surface of the second magnetic material pattern 130 not covered by the tunnel barrier layer pattern 124 during the ion beam etching process, thereby preventing the short circuit between the first magnetic material pattern 110 and the second magnetic material pattern 130.

FIGS. 4 to 9 are cross-sectional views illustrating stages of a method of manufacturing an MTJ structure in accordance with example embodiments.

Figure 4:
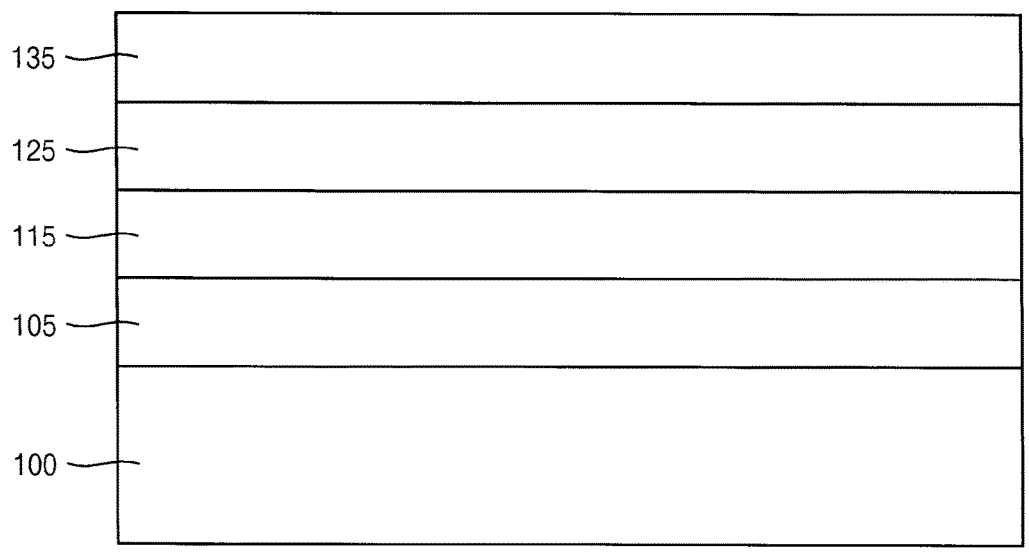

Referring to FIG. 4, a first magnetic material layer 105, a tunnel barrier layer 115, a second magnetic material layer 125, and a conductive layer 135 may be formed sequentially on a substrate 100.

In example embodiments, the first magnetic material layer 105 may be formed to include, e.g., ferro-manganese (FeMn), iridium-manganese (IrMn), platinum-manganese (PtMn), manganese oxide (MnO), manganese sulfide (MnS), manganese telluride (MnTe), manganese fluoride ($MnF_2$), ferrous fluoride ($FeF_2$), ferrous chloride ($FeCl_2$), ferrous oxide (FeO), cobalt chloride ($CoCl_2$), cobalt oxide (CoO), nickel chloride ($NiCl_2$), nickel oxide (NiO), or the like. These materials may be used alone or in a combination thereof.

In example embodiments, the tunnel barrier layer 115 may be formed by forming a metal layer having a metal, e.g., magnesium, aluminum, or the like, and by oxidizing the metal layer. Accordingly, the tunnel barrier layer 115 may be formed to include a metal oxide, e.g., magnesium oxide ($MgO_x$), aluminum oxide ($AlO_x$), or the like.

In example embodiments, the second magnetic material layer 125 may be formed using a ferromagnetic material, e.g., iron (Fe), cobalt (Co), nickel (Ni), chrome (Cr), platinum (Pt), or the like. For example, the second magnetic material layer 125 may be formed to include an alloy, e.g., CoFe, NiFe, FeCr, CoFeNi, PtCr, CoCrPt, CoFeB, NiFeSiB, CoFeSiB, or the like.

Figure 5:
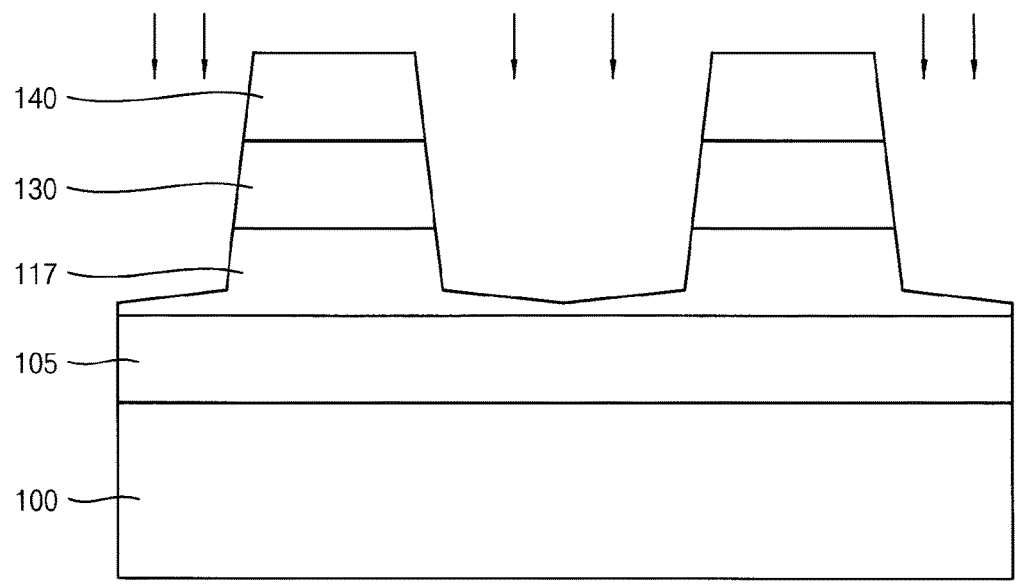

Referring to FIG. 5, the tunnel barrier layer 115, the second magnetic material layer 125, and the conductive layer 135 may be partially removed to form a preliminary tunnel barrier layer pattern 117, a second magnetic material pattern 130, and a conductive pattern 140, respectively.

The tunnel barrier layer 115, the second magnetic material layer 125, and the conductive layer 135 may be removed by a dry etch process, e.g., an ion beam etching process, a sputter etching process, a radio-frequency etching process, or the like. In example embodiments, the ion beam etching process may be performed to pattern the tunnel barrier layer 115, the second magnetic material layer 125, and the conductive layer 135. In the ion beam etching process, ions may be accelerated electrically to collide with an etching target layer. By the collision of the ions, surface atoms of the etching target layer may be scattered so that the tunnel barrier layer 115, the second magnetic material layer 125, and the conductive layer 135 may be etched.

In example embodiments, the second magnetic material layer 125 and the conductive layer 135 may be etched to form a plurality of second magnetic material patterns 130 and a plurality of conductive patterns 140, respectively. The plurality of second magnetic material patterns 130 may be spaced apart from each other, and the plurality of conductive patterns 140 may be spaced apart from each other. In contrast, the tunnel barrier layer 115 may be etched to form the preliminary tunnel barrier layer pattern 117, and in the etching process, a lower portion of the tunnel barrier layer 115 may not be etched. Thus, the tunnel barrier layer 115 may have a plurality of upper portions spaced apart from each other and a single lower portion. Accordingly, sidewalls of the plurality of upper portions of the preliminary tunnel barrier layer pattern 117 may be exposed, while a portion of the lower portion of the preliminary tunnel barrier layer pattern 117 under the sidewalls of the plurality of upper portions thereof may not be exposed. In example embodiments, the first magnetic material layer 105 may not be exposed.

In the ion beam etching process, an upper portion, a central portion, and a lower portion of an etching target layer may be etched in this order. Accordingly, the upper portion of the etching target layer may be etched more than the lower portion thereof. Thus, a width of each of the preliminary tunnel barrier layer patterns 117, the second magnetic material patterns 130, and the conductive patterns 140 may decrease from a bottom portion toward a top portion thereof.

In example embodiments, the conductive layer 135 may be etched simultaneously with, or independently from the tunnel barrier layer 115 and the second magnetic material layer 125.

Figure 6:
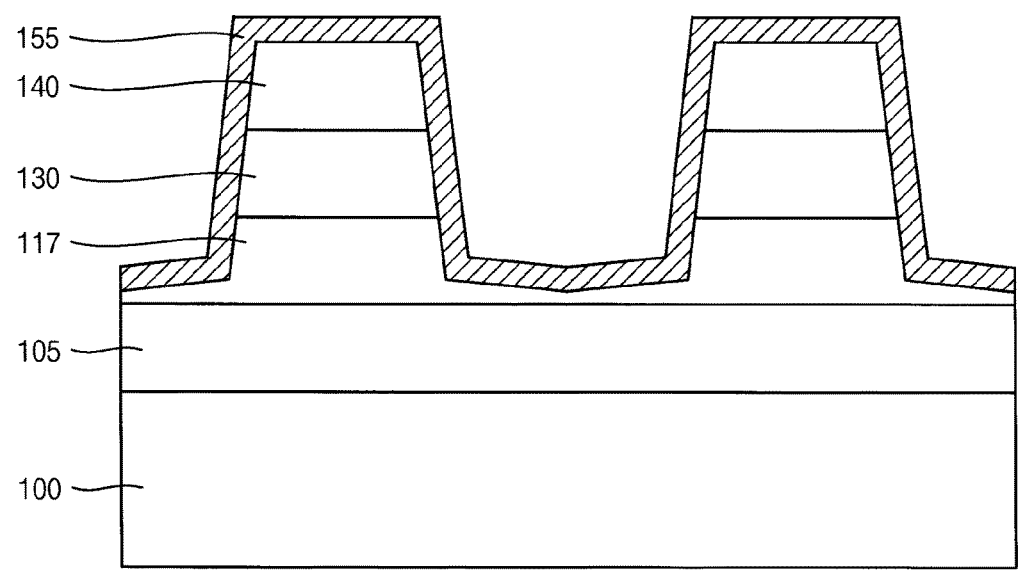

Referring to FIG. 6, a sacrificial layer 155 may be formed on the preliminary tunnel barrier layer pattern 117, the second magnetic material pattern 130, and the conductive pattern 140.

The sacrificial layer 155 may be formed using a material whose etching rate is lower than that of the magnetic material patterns 130 and 117 during an ion etching process. For example, the sacrificial layer 155 may be formed using magnesium oxide ($MgO_x$).

The sacrificial layer 155 may be formed to cover sidewalls of the preliminary tunnel barrier layer pattern 117, the second magnetic material pattern 130, and the conductive pattern 140, and/or top surfaces of the conductive pattern 140 and the preliminary tunnel barrier layer pattern 117.

Figure 7:
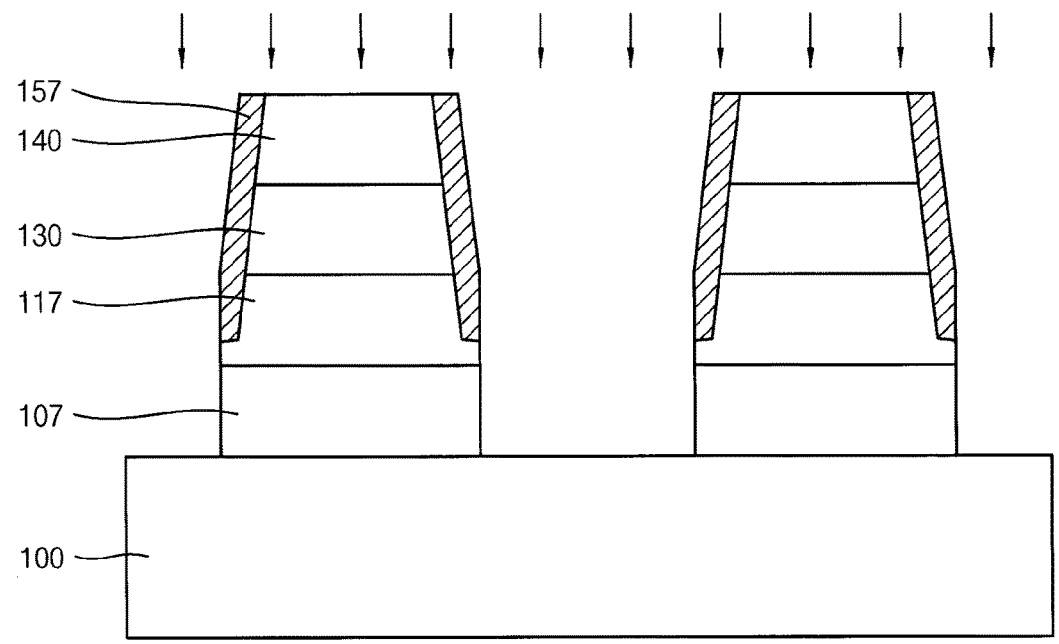

Referring to FIG. 7, the sacrificial layer 155, the preliminary tunnel barrier layer pattern 117, and the first magnetic material layer 105 may be partially removed by an etching process. The sacrificial layer 155, the preliminary tunnel barrier layer pattern 117, and the first magnetic material layer 105 may be removed by a dry etch process, e.g., an ion beam etching process, a sputter etching process, a radio-frequency etching process, or the like. In example embodiments, the ion beam etching process may be performed to pattern the sacrificial layer 155, the preliminary tunnel barrier layer pattern 117, and the first magnetic material layer 105. When the ion beam etching process is performed, ions may be accelerated in a direction substantially perpendicular to a top surface of the substrate 100. Thus, the ion beam etching process may be an anisotropic etching process.

In example embodiments, portions of the sacrificial layer 155 disposed on the top surface of the conductive pattern 140 and the top surface of the preliminary tunnel barrier layer pattern 117 may be removed to form the sacrificial layer pattern 157. Accordingly, the sacrificial layer pattern 157 may be formed to cover sidewalls of the conductive pattern 140, the second magnetic material pattern 130, and the preliminary tunnel barrier layer pattern 117.

The first magnetic material layer 105 and the lower portion of the preliminary tunnel barrier layer pattern 117 may be partially removed to form a plurality of first preliminary magnetic material patterns 107 and a plurality of preliminary tunnel barrier layer patterns 117, respectively. The plurality of first preliminary magnetic material patterns 107 may be spaced apart from each other, and the plurality of preliminary tunnel barrier layer patterns 117 may be spaced apart from each other.

In the ion beam etching process, an upper portion, a central portion, and a lower portion of an etching target layer may be etched in this order. Accordingly, the upper portion of the etching target layer may be etched more than the lower portion thereof. Thus, a width of each of the preliminary tunnel barrier layer patterns 117 and the first preliminary magnetic material patterns 107 may decrease from a bottom portion toward a top portion thereof.

Figure 8:
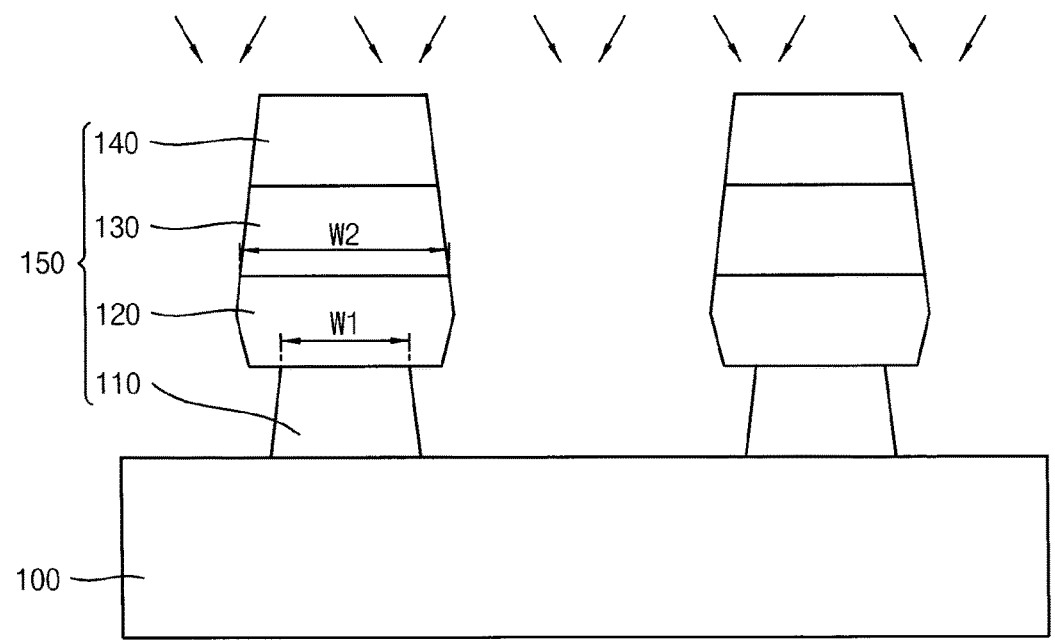

Referring to FIG. 8, each of the preliminary tunnel barrier layer pattern 117 and the first preliminary magnetic material pattern 107 may be partially removed by an etching process. The preliminary tunnel barrier layer pattern 117 and the first preliminary magnetic material pattern 107 may be removed by a dry etch process, e.g., an ion beam etching process, a sputter etching process, a radio-frequency etching process, or the like. In example embodiments, the ion beam etching process may be performed to pattern the preliminary tunnel barrier layer pattern 117 and the first preliminary magnetic material pattern 107. When the ion beam etching process is performed, ions may be accelerated in a direction inclined with respect to the direction substantially perpendicular to the top surface of the substrate 100. Thus, the ion beam etching process may be an anisotropic etching process. Accordingly, during the ion beam etching process, each of the preliminary tunnel barrier layer pattern 117 and the first preliminary magnetic material pattern 107 may be etched from a sidewall by the ions accelerated in the above inclined direction.

In example embodiments, the conductive pattern 140, the second magnetic material pattern 130, and the upper portion of the preliminary tunnel barrier layer pattern 117 that may be protected by the sacrificial layer pattern 157 may not be etched. In contrast, the lower portion of the preliminary tunnel barrier layer pattern 117 and a sidewall of the first magnetic material pattern 107 that may not be covered by the sacrificial layer pattern 157 may be removed, thereby forming a tunnel barrier layer pattern 120 and a first magnetic material pattern 110, respectively.

The sidewall of the first magnetic material pattern 107 may be further etched by the etching process, and thus a first width W1 of a top surface of the first magnetic material pattern 110 may be less than a second width W2 of a bottom surface of the second magnetic material pattern 130. A lower portion of the preliminary tunnel barrier layer pattern 117 may be removed, and thus the sidewall of the tunnel barrier layer pattern 120 may be inclined by a negative slope at least at a portion thereof, which may prevent the re-deposition phenomenon.

The ions may be accelerated in the inclined direction, and thus materials re-deposited on the sidewall of the preliminary tunnel barrier layer pattern 117 during the processes illustrated with reference to FIGS. 5 and 7 may be removed. As a result, the short circuit in the MTJ structure may be prevented, and thus the MTJ structure may have an improved reliability.

The etching processes illustrated with reference to FIGS. 7 and 8 have been performed independently, however, example embodiments the present inventive concepts are not be limited thereto. For example, the etching processes illustrated with reference to FIGS. 7 and 8 may be performed simultaneously.

Figure 9:
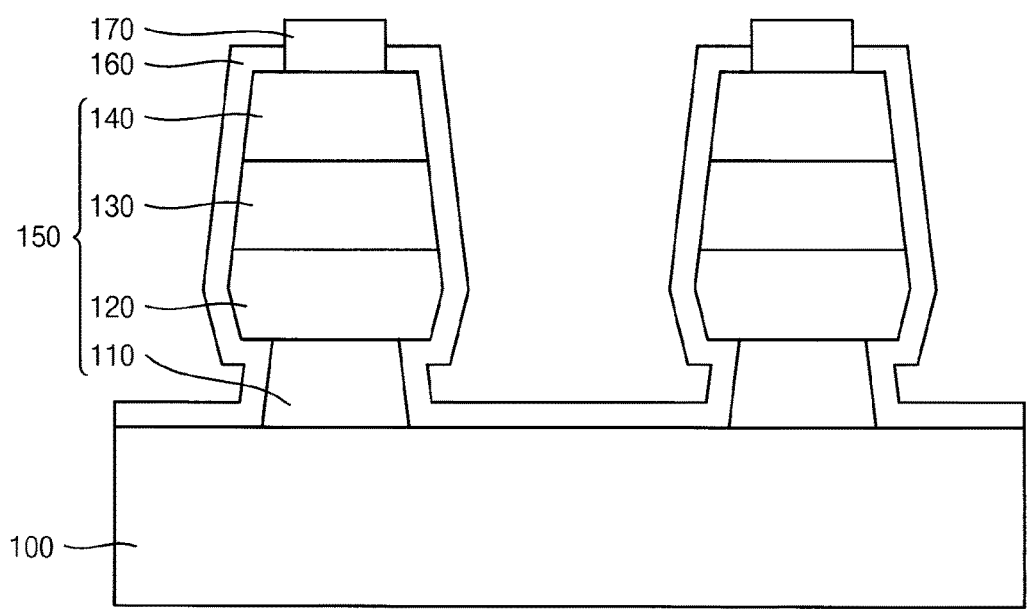

Referring to FIG. 9, an upper electrode 170 electrically connected to the conductive pattern 140 may be formed, after forming a spacer layer 160.

The spacer layer 160 may be formed on sidewalls of the first magnetic material pattern 110, the tunnel barrier layer pattern 120, the second magnetic material pattern 130, and the conductive pattern 140, and/or top surfaces of the conductive pattern 140 and the substrate 100. The spacer layer 160 may protect the first magnetic material pattern 110, the tunnel barrier layer pattern 120, the second magnetic material pattern 130, and the conductive pattern 140 from oxygen and/or moisture.

FIGS. 10 to 13 are cross-sectional views illustrating stages of a method of manufacturing an MTJ structure in accordance with example embodiments.

Figure 10:
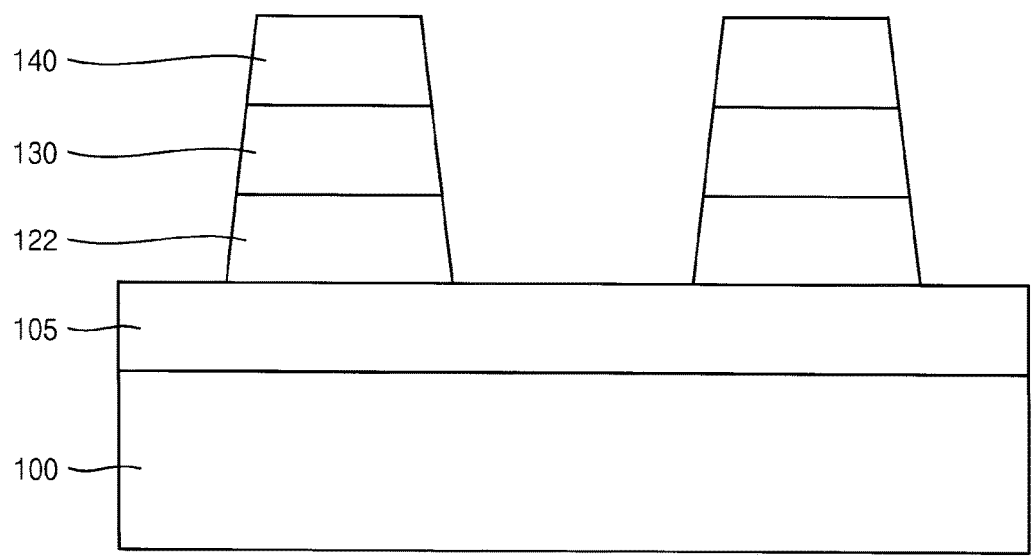

Referring to FIG. 10, a first magnetic material layer 105, a tunnel barrier layer, a second magnetic material layer, and a conductive layer may be formed sequentially on a substrate 100. The tunnel barrier layer, the second magnetic material layer, and the conductive layer may be partially removed to form a plurality of tunnel barrier layers 122, a plurality of second magnetic material patterns 130, and a plurality of conductive patterns 140, respectively.

In example embodiments, the tunnel barrier layer, the second magnetic material layer, and the conductive layer may be partially removed by an etching process, e.g., an ion beam etching process.

The plurality of tunnel barrier layer patterns 122 may be spaced apart from each other, the plurality of second magnetic material patterns 130 may be spaced apart from each other, and the plurality of conductive patterns 140 may be spaced apart from each other. Accordingly, a top surface of the first magnetic material layer 105 and a sidewall of the tunnel barrier layer pattern 122 may be exposed. In example embodiments, an upper portion of the first magnetic material layer 105 may be removed partially.

Figure 11:
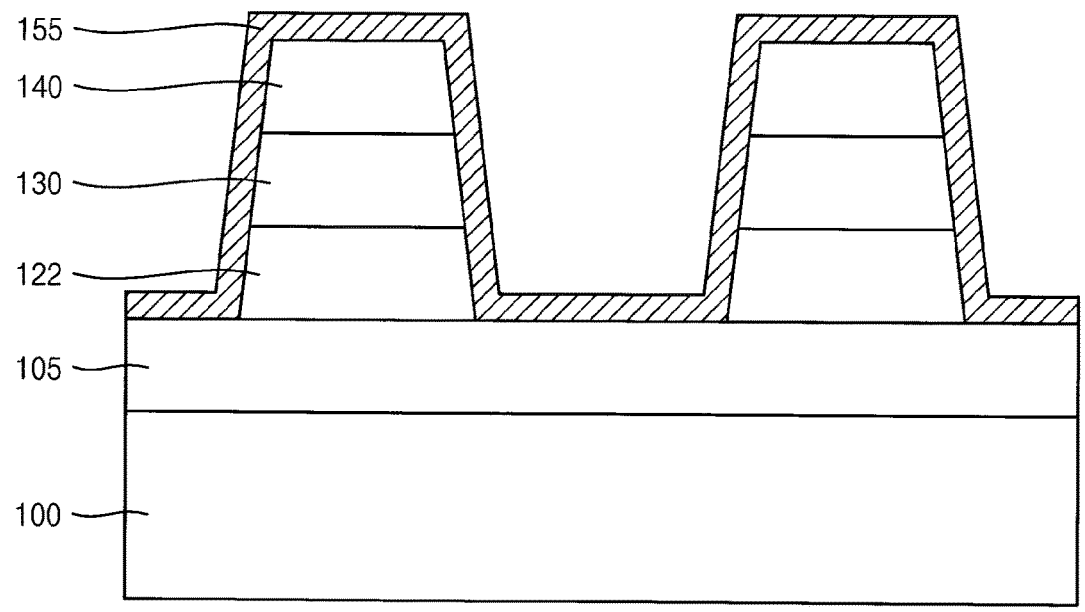

Referring to FIG. 11, a sacrificial layer 155 may be formed on the tunnel barrier layer pattern 122, the second magnetic material pattern 130, and the conductive pattern 140.

The process for forming the sacrificial layer 155 may be substantially the same as or similar to that illustrated with reference to FIG. 6. However, the sacrificial layer 155 may be formed on sidewalls of the tunnel barrier layer pattern 122, the second magnetic material pattern 130 and the conductive pattern 140, a top surface of the conductive pattern 140, and the exposed top surface of the first magnetic material layer 105.

Figure 12:
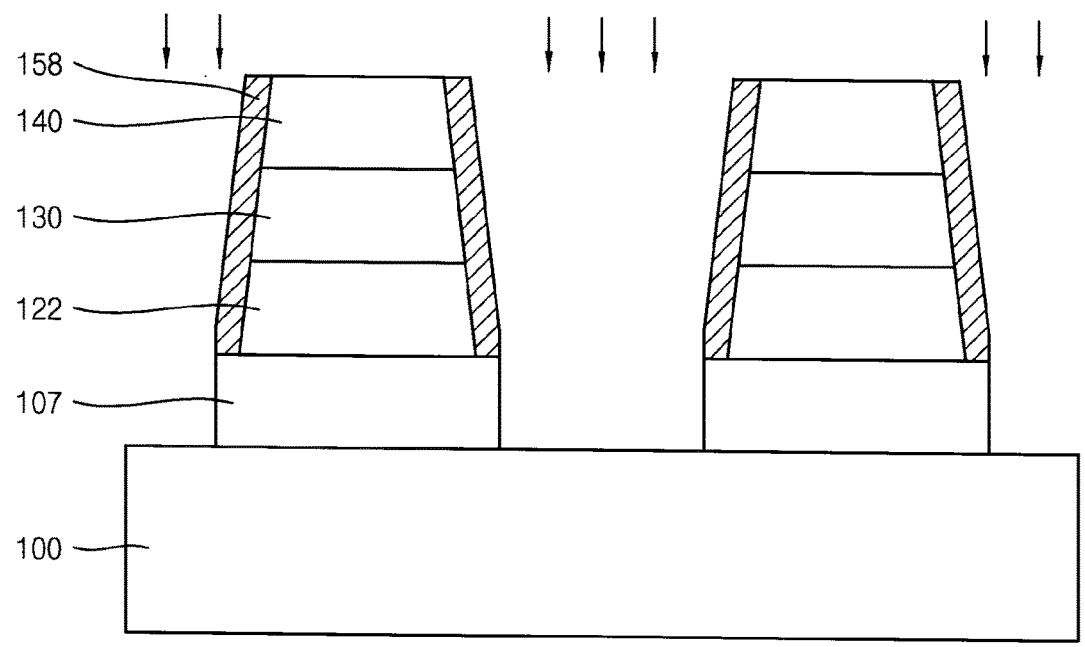

Referring to FIG. 12, the sacrificial layer 155 and the first magnetic material layer 105 may be partially removed by an etching process.

The sacrificial layer 155 and the first magnetic material layer 105 may be partially removed by an etching process, e.g., an ion beam etching process. When the ion beam etching process is performed, ions may be accelerated in a direction substantially perpendicular to a top surface of the substrate 100. Thus, the ion beam etching process may be an anisotropic etching process.

In example embodiments, portions of the sacrificial layer 155 disposed on the top surfaces of the conductive pattern 140 and the first magnetic material layer 105 may be removed to form a sacrificial layer pattern 158. Accordingly, the sacrificial layer pattern 158 may be formed to cover the sidewalls of the conductive pattern 140, the second magnetic material pattern 130, and the tunnel barrier layer pattern 122.

The first magnetic material layer 105 may be partially removed to form a plurality of first preliminary magnetic material patterns 107. The plurality of first preliminary magnetic material patterns 107 may be spaced apart from each other.

Figure 13:
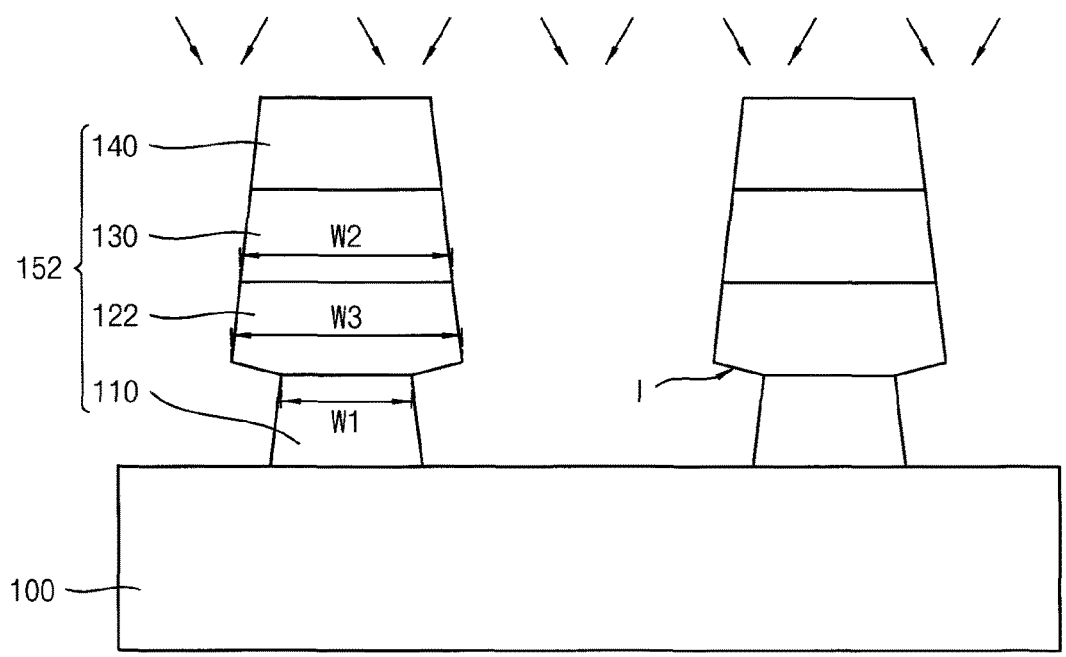

Referring to FIG. 13, the first preliminary magnetic material pattern 107 may be partially removed by an etching process.

The etching process may be substantially the same as or similar to that illustrated with reference to FIG. 8. However, the conductive pattern 140, the second magnetic material pattern 130, and the tunnel barrier layer pattern 122 that may be protected by the sacrificial layer pattern 158 may not be etched, while a sidewall of the first preliminary magnetic material pattern 107 may be removed so that a first magnetic material pattern 110 may be formed.

The first preliminary magnetic material pattern 107 may be further etched by the etching process, and thus a first width W1 of a top surface of the first magnetic material pattern 110 may be less than a second width W2 of a bottom surface of the second magnetic material pattern 130. The first width W1 of the top surface of the first magnetic material pattern 110 may be less than a third width W3 of a bottom surface of the tunnel barrier layer pattern 122. Accordingly, a portion of the bottom surface I of the tunnel barrier layer pattern 122, which may be adjacent to the top surface of the first magnetic material pattern 110 but exposed, may be inclined by a negative slope. Thus, the re-deposition phenomenon may be prevented during the ion beam etching process.

The etching processes illustrated with reference to FIGS. 12 and 13 have been performed independently, however, example embodiments of the present inventive concepts are not be limited thereto. For example, the etching processes illustrated with reference to FIGS. 12 and 13 may be performed simultaneously.

Figure 14:
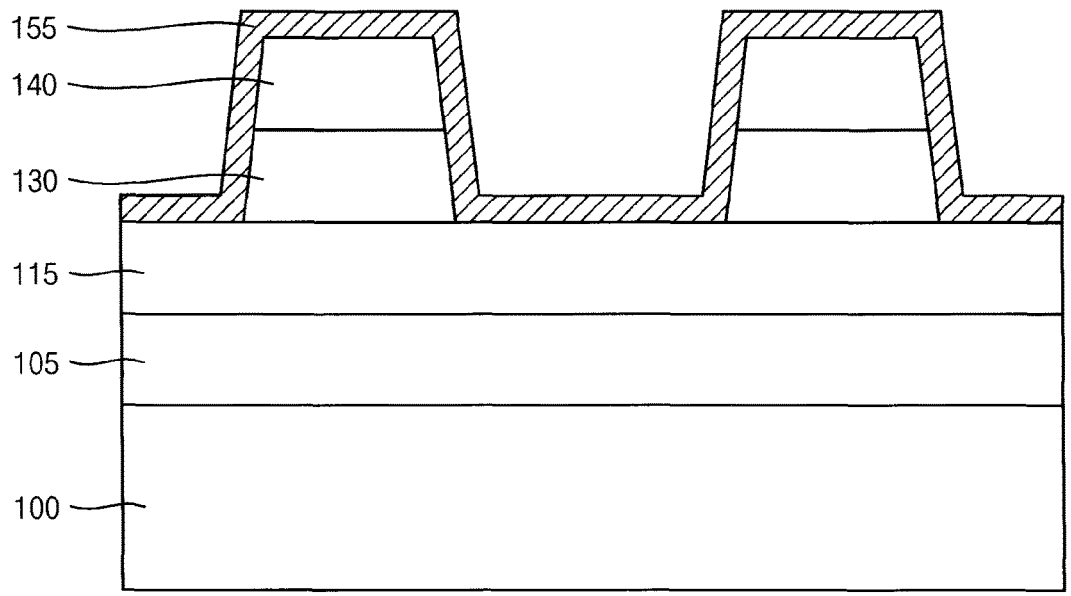
Figure 15:
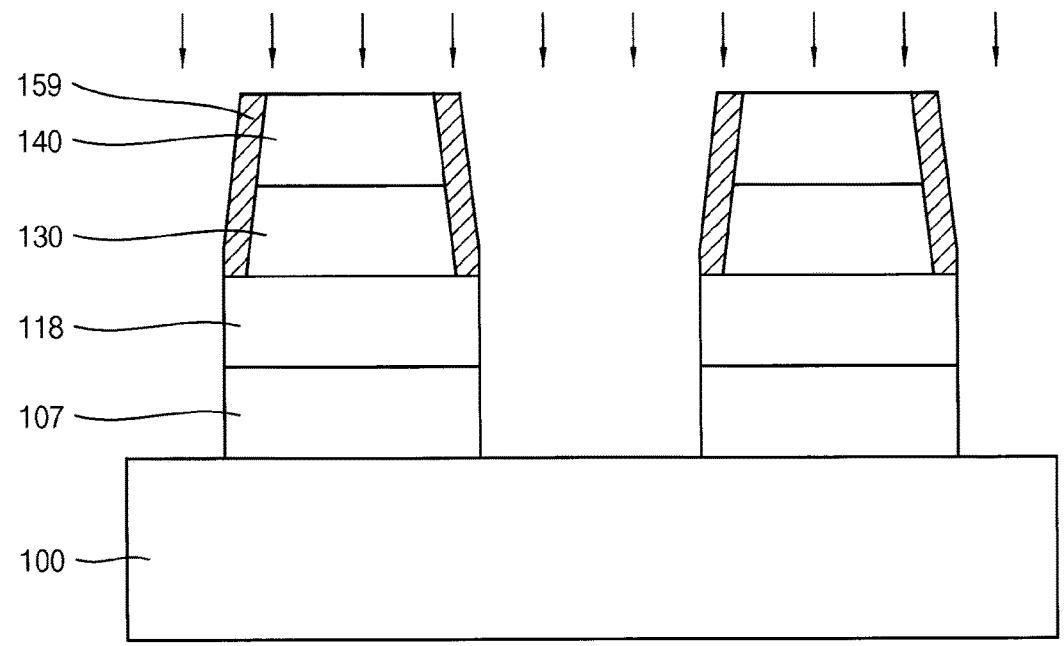
Figure 16:
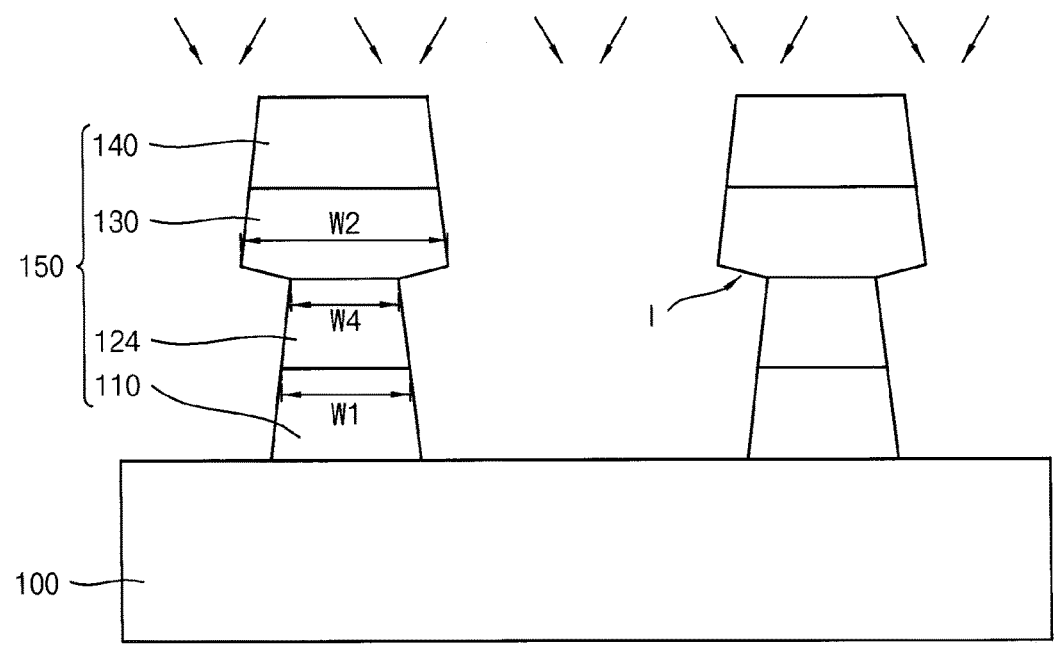

FIGS. 14 to 16 are cross-sectional views illustrating stages of a method of manufacturing an MTJ structure in accordance with example embodiments.

Referring to FIG. 14, a first magnetic material layer 105, a tunnel barrier layer 115, a second magnetic material layer (not shown), and a conductive layer (not shown) may be sequentially formed on a substrate 100. The second magnetic material layer and the conductive layer may be partially removed to form a plurality of second magnetic material patterns 130 and a plurality of conductive patterns 140, respectively. A sacrificial layer 155 may be formed on the tunnel barrier layer 115, the second magnetic material pattern 130, and the conductive pattern 140.

In example embodiments, the second magnetic material layer and the conductive layer may be partially removed by a dry etch process, e.g., an ion beam etching process.

The plurality of second magnetic material patterns 130 may be spaced apart from each other, and the plurality of conductive patterns 140 may be spaced apart from each other. Accordingly, a top surface of the tunnel barrier layer 115 may be exposed. In example embodiments, an upper portion of the tunnel barrier layer 115 may be removed partially.

The process for forming the sacrificial layer 155 may be substantially the same as or similar to that illustrated with reference to FIG. 6. However, the sacrificial layer 155 may be formed on the exposed top surface of the tunnel barrier layer 115, sidewalls of the second magnetic material pattern 130 and the conductive pattern 140a, and a top surface of the conductive pattern 140.

Referring to FIG. 15, the sacrificial layer 155, the tunnel barrier layer 115, and the first magnetic material layer 105 may be partially removed by an etching process.

The sacrificial layer 155, the tunnel barrier layer 115, and the first magnetic material layer 105 may be partially removed by a dry etch process, e.g., an ion beam etching process. In the ion beam etching process, ions may be accelerated in a direction substantially perpendicular to a top surface of the substrate 100.

In example embodiments, portions of the sacrificial layer 155 disposed on the top surfaces of the conductive pattern 140 and the tunnel barrier layer 115 may be removed to form a sacrificial layer pattern 159. Accordingly, the sacrificial layer pattern 159 may be formed to cover sidewalls of the conductive pattern 140 and the second magnetic material pattern 130.

The tunnel barrier layer 115 and the first magnetic material layer 105 may be partially removed to form a plurality of preliminary tunnel barrier layer patterns 118 and a plurality of first preliminary magnetic material patterns 107, respectively. The plurality of preliminary tunnel barrier layer patterns 118 may be spaced apart from each other, and the plurality of first preliminary magnetic material patterns 107 may be spaced apart from each other.

Referring to FIG. 16, the preliminary tunnel barrier layer pattern 118 and the first preliminary magnetic material pattern 107 may be partially removed by an etching process.

The etching process may be substantially the same as or similar to that illustrated with reference to FIG. 8. However, the conductive pattern 140 and the second magnetic material pattern 130 that may be protected by the sacrificial layer pattern 159 may not be etched, while sidewalls of the preliminary tunnel barrier layer pattern 118 and the first preliminary magnetic material pattern 107 may be removed so that a tunnel barrier layer pattern 124 and a first magnetic material pattern 110 may be formed, respectively.

The preliminary tunnel barrier layer pattern 118 and the first preliminary magnetic material pattern 107 may be further etched by the etching process, a first width W1 of a top surface of the first magnetic material pattern 110 may be less than a second width W2 of a bottom surface of the second magnetic material pattern 130. The second width W2 of the bottom surface of the second magnetic material pattern 130 may be greater than a fourth width W4 of a top surface of the tunnel barrier layer pattern 124. Accordingly, a portion of the bottom surface I of the second magnetic material pattern 130 adjacent to the top surface of the tunnel barrier layer pattern 124 but exposed may be inclined by a negative slope. Thus, the re-deposition phenomenon may be prevented during the ion beam etching process.

The etching processes illustrated with reference to FIGS. 15 and 16 have been performed independently, however, example embodiments the present inventive concepts are not be limited thereto. For example, the etching processes illustrated with reference to FIGS. 15 and 16 may be performed simultaneously.

FIGS. 17 to 26 are cross-sectional views illustrating stages of a method of manufacturing an MRAM device in accordance with example embodiments.

Figure 17:
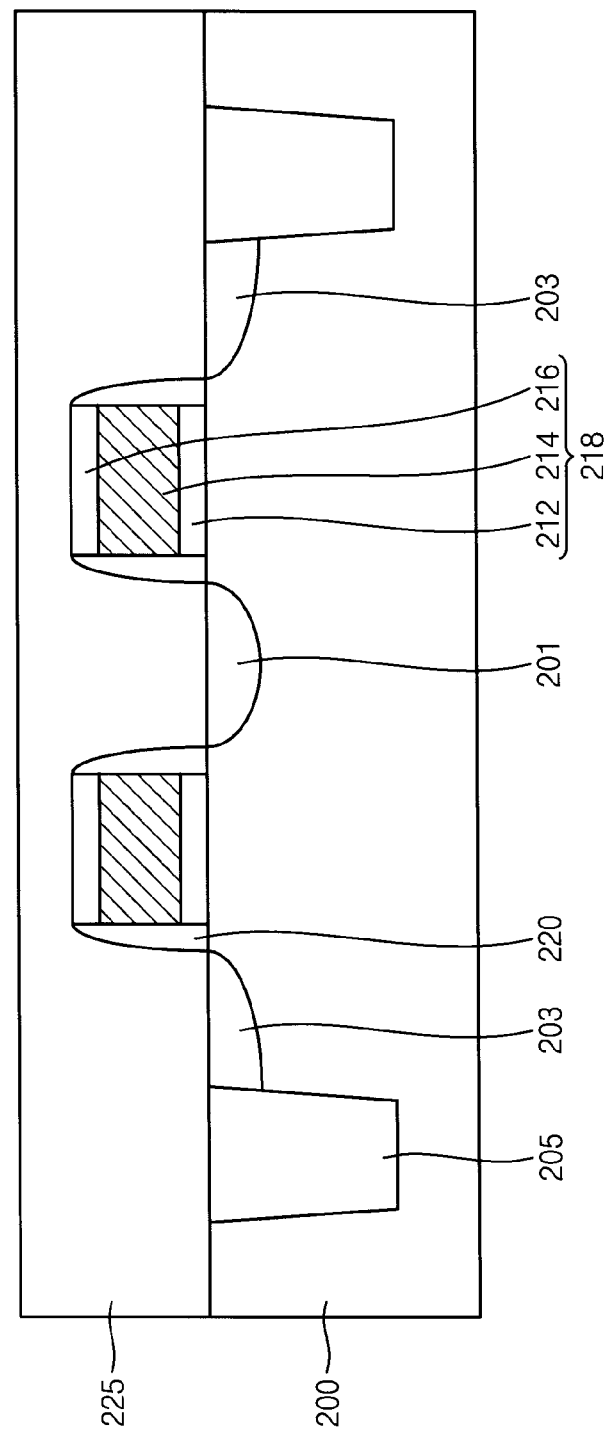

Referring to FIG. 17, an isolation layer 205 may be formed on a substrate 200, and a switching element, e.g., a transistor may be formed on an active region of the substrate 200.

The substrate 200 may include silicon, germanium, silicon-germanium, and/or III-IV compound semiconductor, e.g., GaP, GaAs, GaSb, or the like. A silicon-on-insulator (SOI) substrate or a germanium-on-insulator (GOI) substrate may be used as the substrate 200.

For example, the isolation layer 205 may be formed by a shallow trench isolation (STI) process. The substrate 200 may be divided into an active region and a field region by the isolation layer 205. The isolation layer 205 may be formed to include an insulating material, e.g., silicon oxide.

A gate insulation layer, a gate electrode layer, and a gate mask layer may be sequentially formed on the substrate 200. The gate mask layer may be partially etched to form a gate mask pattern 216. The gate electrode layer and the gate insulation layer may be sequentially etched using the gate mask pattern 216 as an etching mask. Accordingly, a gate structure 218 including a gate insulation layer 212, a gate electrode 214, and the gate mask pattern 216 sequentially stacked on the substrate 200 may be formed.

The gate insulation layer may be formed to include, e.g., a metal oxide, silicon oxide, or the like. The gate electrode layer may be formed to include, e.g., a metal, a metal silicide, a metal nitride, or the like. The gate mask layer may be formed to include, e.g., silicon nitride. Each of the gate insulation layer, the gate electrode layer, and the gate mask layer may be formed by a chemical vapor deposition (CVD) process, an atomic layer deposition (ALD) process, a sputtering process, a physical layer deposition (PVD) process, or the like. In example embodiments, the gate insulation layer may be formed by thermally oxidizing a top surface of the substrate 200.

A gate spacer 220 may be further formed on a sidewall of the gate structure 218. In example embodiments, a spacer layer covering the gate structure 218 may be formed on the substrate 200 to include, e.g., silicon nitride, and the spacer layer may be etched anisotropically to form the gate spacer 220.

An ion implantation process may be performed using the gate structure 218 as an ion implantation mask to form a first impurity region 201 and a second impurity region 203 at upper portions of the substrate 200 adjacent to the gate structure 218.

Accordingly, the transistor having the gate structure 218, the first impurity region 201, and the second impurity region 203 may be formed on the active region of the substrate 200. The gate electrode 214 may serve as a word line of the MRAM device.

The gate structure 218 on the top surface of the substrate 200 is shown in FIG. 17, however, example embodiments of the present inventive concept are not be limited thereto. In example embodiments, the gate structure 218 may be formed to be partially or fully buried in an upper portion of the substrate 200.

A first insulating interlayer 225 covering the transistor may be formed on the substrate 200. The first insulating interlayer 225 may be formed to include silicon oxide, e.g., plasma enhanced oxide (PEOX), tetraethyl orthosilicate (TEOS), boro silicate glass (BSG), phospho silicate glass (PSG), boro phospho silicate glass (BPSG), or the like. The first insulating interlayer 225 may be formed by a CVD process, an ALD process, a spin coating process, or the like.

Figure 18:
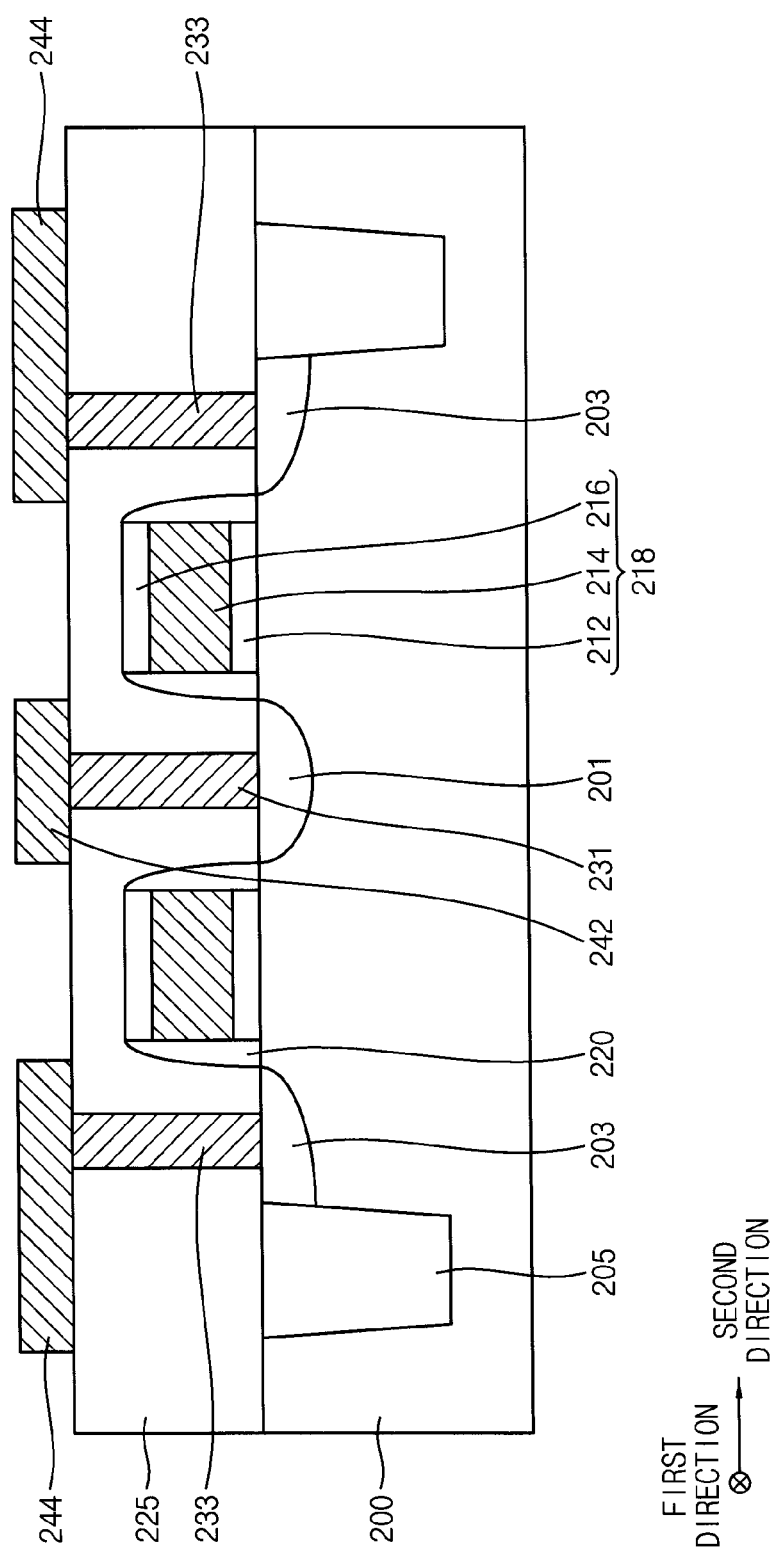

Referring to FIG. 18, contacts and conductive lines that may be connected electrically to the first and second impurity regions 201 and 203 may be formed.

In example embodiments, the first insulating interlayer 225 may be removed partially to form a first contact hole and a second contact hole exposing the first impurity region 201 and the second impurity region 203, respectively. A contact conductive layer may be formed to sufficiently fill the first and second contact holes, and an upper portion of the contact conductive layer may be planarized until a top surface of the first insulating interlayer 225 may be exposed to form a first contact 231 and a second contact 233 in the first contact hole and the second contact hole, respectively. The first contact 231 and the second contact 233 may contact the first impurity region 201 and the second impurity region 203, respectively. For example, the planarization process may be performed by, e.g., a chemical mechanical polishing (CMP) process.

A first conductive layer may be formed on the first insulating interlayer 225, the first contact 231, and the second contact 233. The first conductive layer may be patterned to form a first conductive line 242 and a second conductive line 244.

The first conductive line 242 may extend in a first direction to be electrically connected to the first contacts 231. The first conductive line 242 may serve as a common source line (CSL) of the MRAM device.

In example embodiments, the second conductive line 244 may be electrically connected to the second contacts 233. Alternatively, the second conductive line 244 may be patterned to be electrically connected to each of the second contacts 233.

The contact conductive layer and the first conductive layer may be formed to include a metal, e.g., copper, tungsten, aluminum, or the like, or a metal nitride. The contact conductive layer and the first conductive layer may be formed by a sputtering process, an ALD process, a PVD process, or the like.

Figure 19:
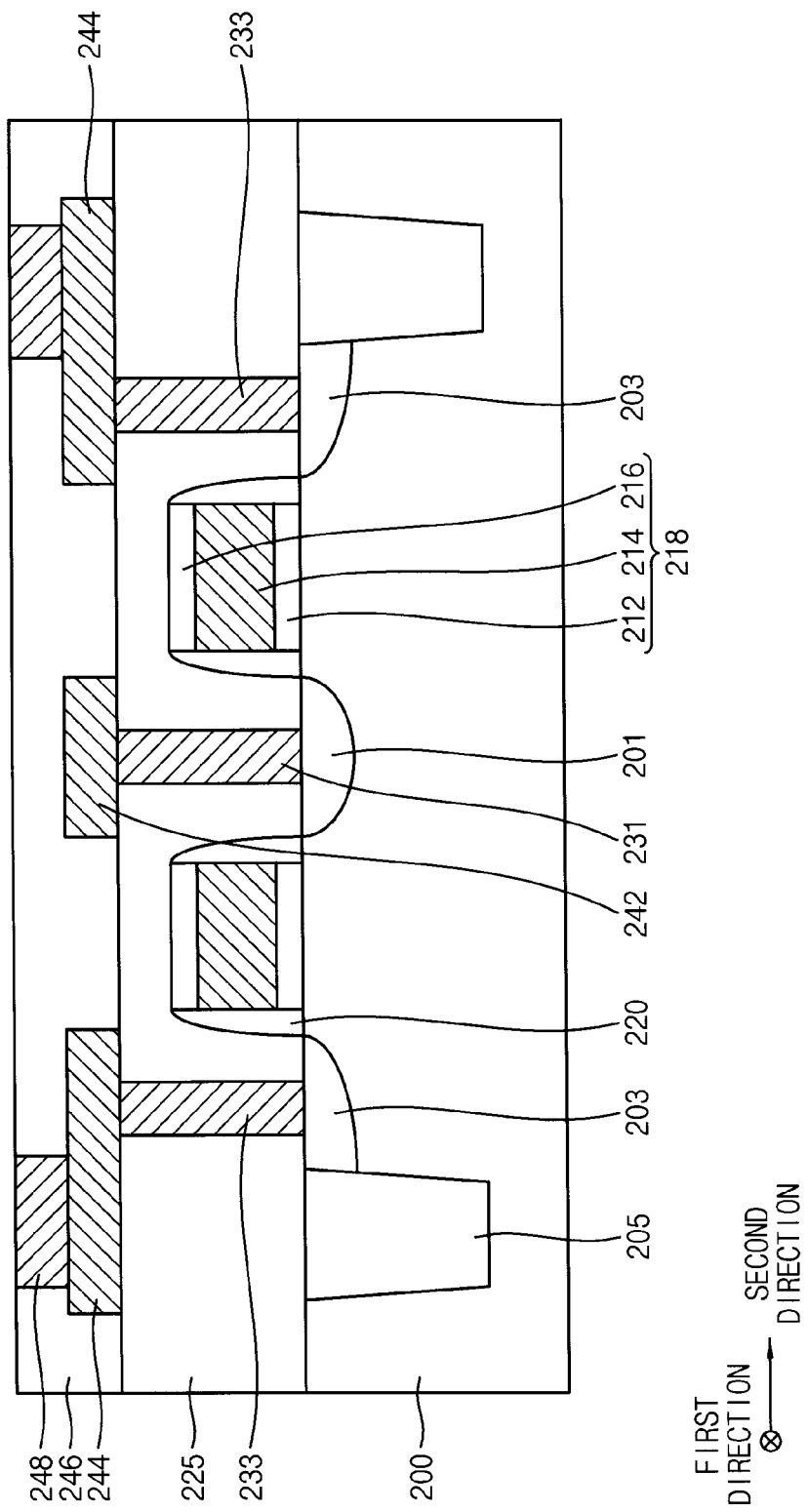

Referring to FIG. 19, a second insulating interlayer 246 covering the first and second conductive lines 242 and 244 may be formed on the first insulating interlayer 225. A lower electrode 248 electrically connected to the second conductive line 244 may be formed in the second insulating interlayer 246.

The second insulating interlayer 246 may be formed of a material substantially the same as or similar to that of the first insulating interlayer 225, e.g., silicon oxide.

In example embodiments, the second insulating interlayer 246 may be etched partially to form recesses exposing the second conductive lines 244, and a lower electrode layer may be formed on the second conductive line 244 and the second insulating interlayer 246 to fill the recesses. An upper portion of the lower electrode layer may be planarized until a top surface of the second insulating interlayer 246 may be exposed to form a plurality of lower electrodes 248. For example, the planarization process may be performed by a CMP process. Each of the lower electrodes 248 may be formed to have a pillar shape of which a top view may be a circle or a polygon.

Depending on the arrangement of the recesses, the plurality of lower electrodes 248 may be formed along the first direction to form a lower electrode column. Additionally, a plurality of lower electrode columns may be formed along a second direction substantially perpendicular to the first direction.

In example embodiments, the lower electrode 248 may be formed to have a diameter or width of, e.g., less than about 30 nm. In example embodiments, the lower electrode 248 may be formed to have a diameter or width of less than about 20 nm, preferably, about 10 nm to about 20 nm.

Figure 20:
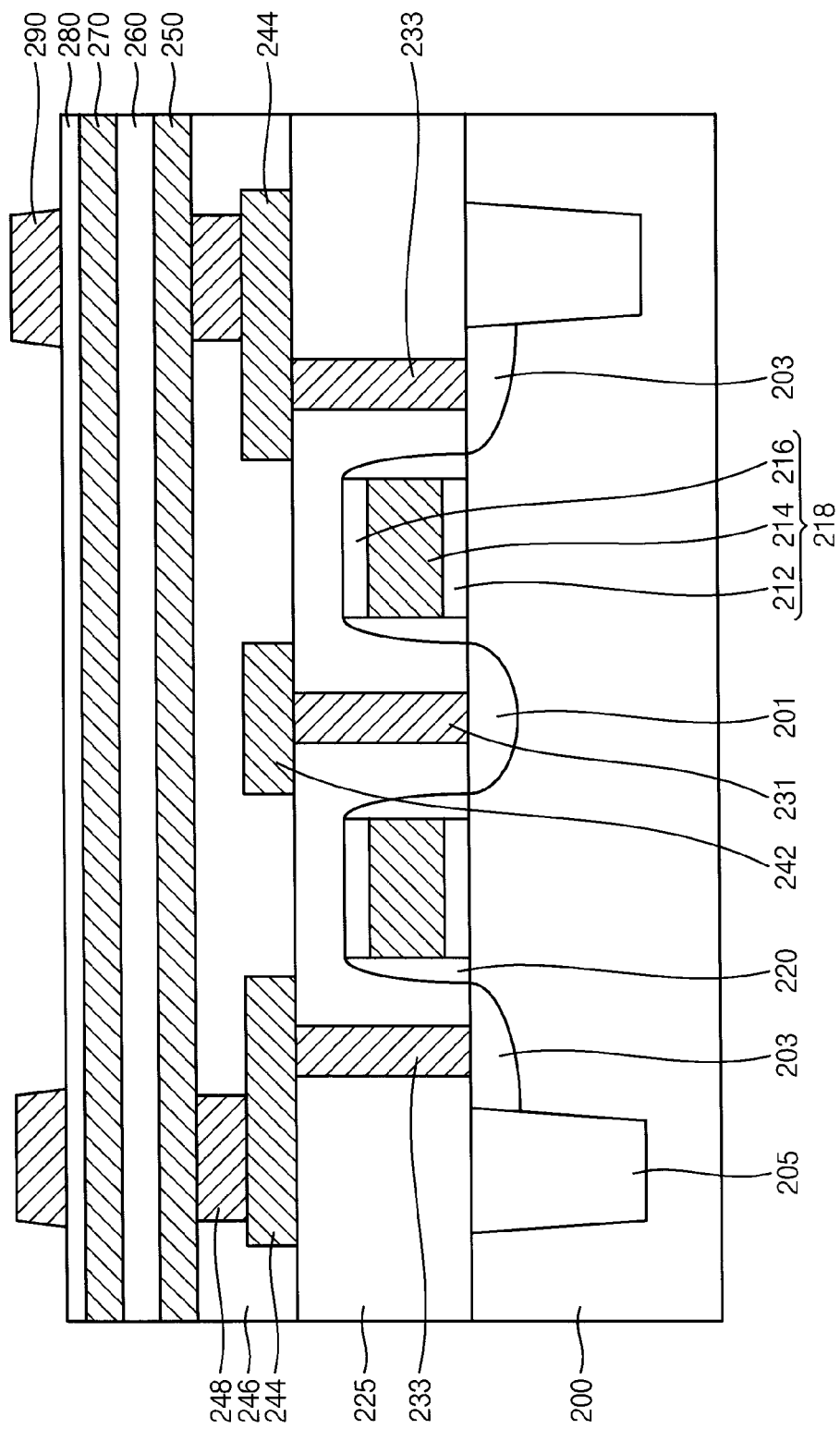

Referring to FIG. 20, a first magnetic material layer 250, a tunnel barrier layer 260, a second magnetic material layer 270, a second conductive layer 280 and a third conductive layer may be sequentially formed on the second insulating interlayer 246 to cover the lower electrodes 248. The third conductive layer may be removed partially to form a plurality of third conductive patterns 290.

In example embodiments, the first magnetic material layer 250 may be formed to include, e.g., ferro-manganese (FeMn), iridium-manganese (IrMn), platinum-manganese (PtMn), manganese oxide (MnO), manganese sulfide (MnS), manganese telluride (MnTe), manganese fluoride ($MnF_2$), ferrous fluoride ($FeF_2$), ferrous chloride ($FeCl_2$), ferrous oxide (FeO), cobalt chloride ($CoCl_2$), cobalt oxide (CoO), nickel chloride ($NiCl_2$), nickel oxide (NiO), or the like. The first magnetic material layer 250 may serve as a fixed layer of the MRAM device. The first magnetic material layer 250 may be formed by a sputtering process, a CVD process, an ALD process, or the like.

In example embodiments, a metal layer having a metal, e.g., magnesium, aluminum, or the like may be formed, and the metal layer may be oxidized to form the tunnel barrier layer 260. Accordingly, the tunnel barrier layer 260 may be formed to include a metal oxide, e.g., magnesium oxide ($MgO_x$), aluminum oxide ($AlO_x$), or the like.

In example embodiments, the second magnetic material layer 270 may be formed by a deposition process using a ferromagnetic metal target, e.g., cobalt, iron, nickel, chrome, platinum, or the like. For example, the deposition process may be a sputtering process. Accordingly, the second magnetic material layer 270 may be formed of an alloy, e.g., CoFe, NiFe, FeCr, CoFeNi, PtCr, CoCrPt, CoFeB, NiFeSiB, CoFeSiB, or the like.

In example embodiments, a metal layer having a metal, e.g., magnesium, aluminum, or the like may be formed, and the metal layer may be oxidized to form the second conductive layer 280. Accordingly, the second conductive layer 280 may be formed to include a metal oxide, e.g., magnesium oxide ($MgO_x$), aluminum oxide ($AlO_x$), or the like.

A concentration of oxygen atoms in the metal oxide of the second conductive layer 280 may be lower than that of the metal oxide of the tunnel barrier layer 260. A thickness of the second conductive layer 280 may be less than half of a thickness of the tunnel barrier layer 260. Accordingly, the second conductive layer 280 may have a conductivity greater than that of the tunnel barrier layer 260. That is, the second conductive layer 280 may serve as an electric conductor, and the conductivity of the tunnel barrier layer 260 may be changed according to neighboring magnetic material patterns.

The third conductive pattern 290 may have a single layer structure or a multi-layered structure. In example embodiments, a layer including, e.g., ruthenium (Ru), titanium nitride (TiN), and tungsten (W) may be formed on the second conductive layer 280, and may be etched partially to form the third conductive pattern 290.

The second conductive layer 280 and the third conductive pattern 290 may reduce the contact resistance of an MTJ structure illustrated later, and may protect the MTJ structure.

Figure 21:
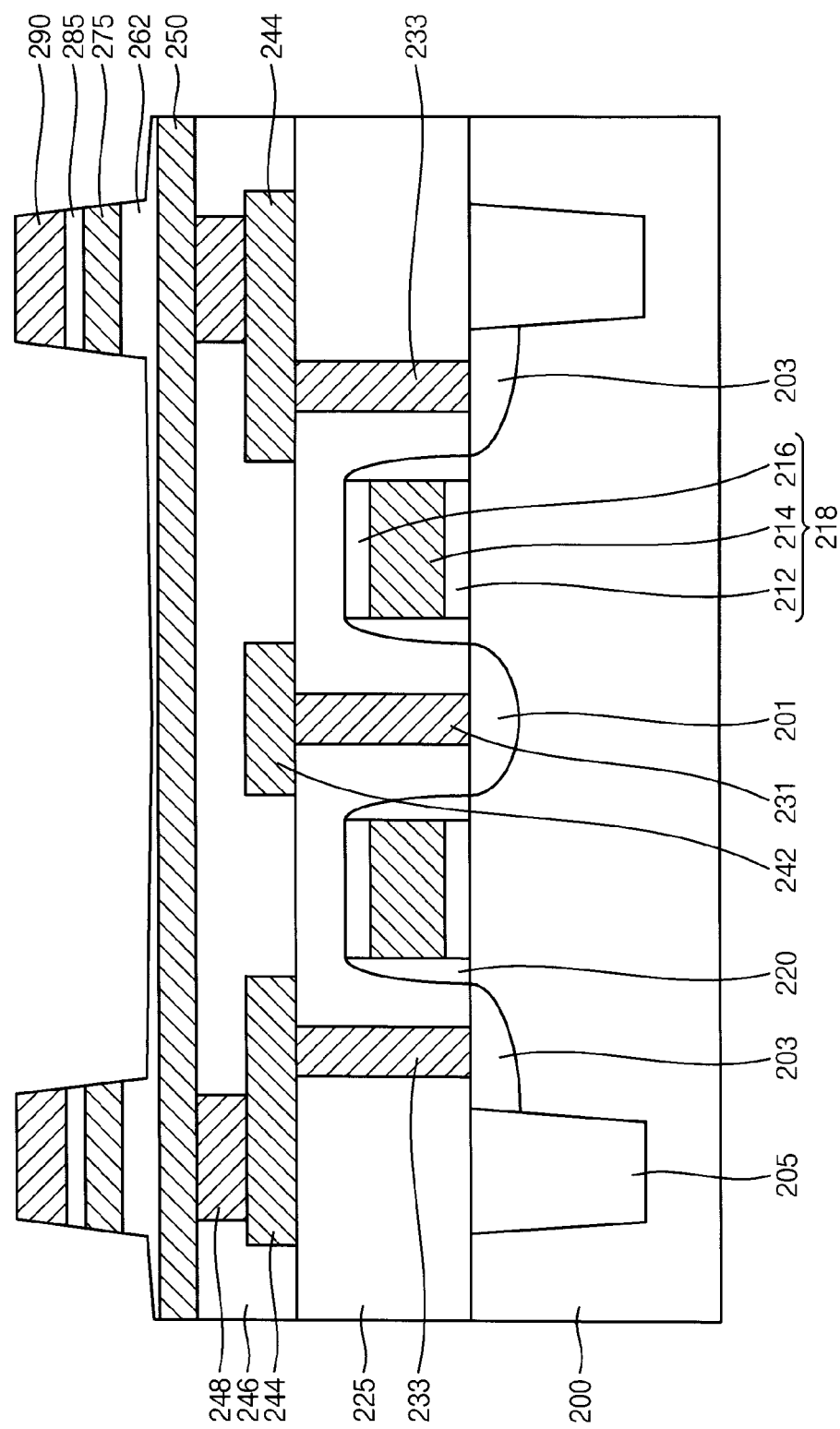

Referring to FIG. 21, the second conductive layer 280, the second magnetic material layer 270, and the tunnel barrier layer 260 may be removed partially to form a plurality of second conductive patterns 285, a plurality of second magnetic material patterns 275, and a preliminary tunnel barrier layer pattern 262, respectively. The etching process may be substantially the same as or similar to those illustrated with reference to FIG. 5, and thus detailed descriptions thereon may be omitted herein.

Figure 22:
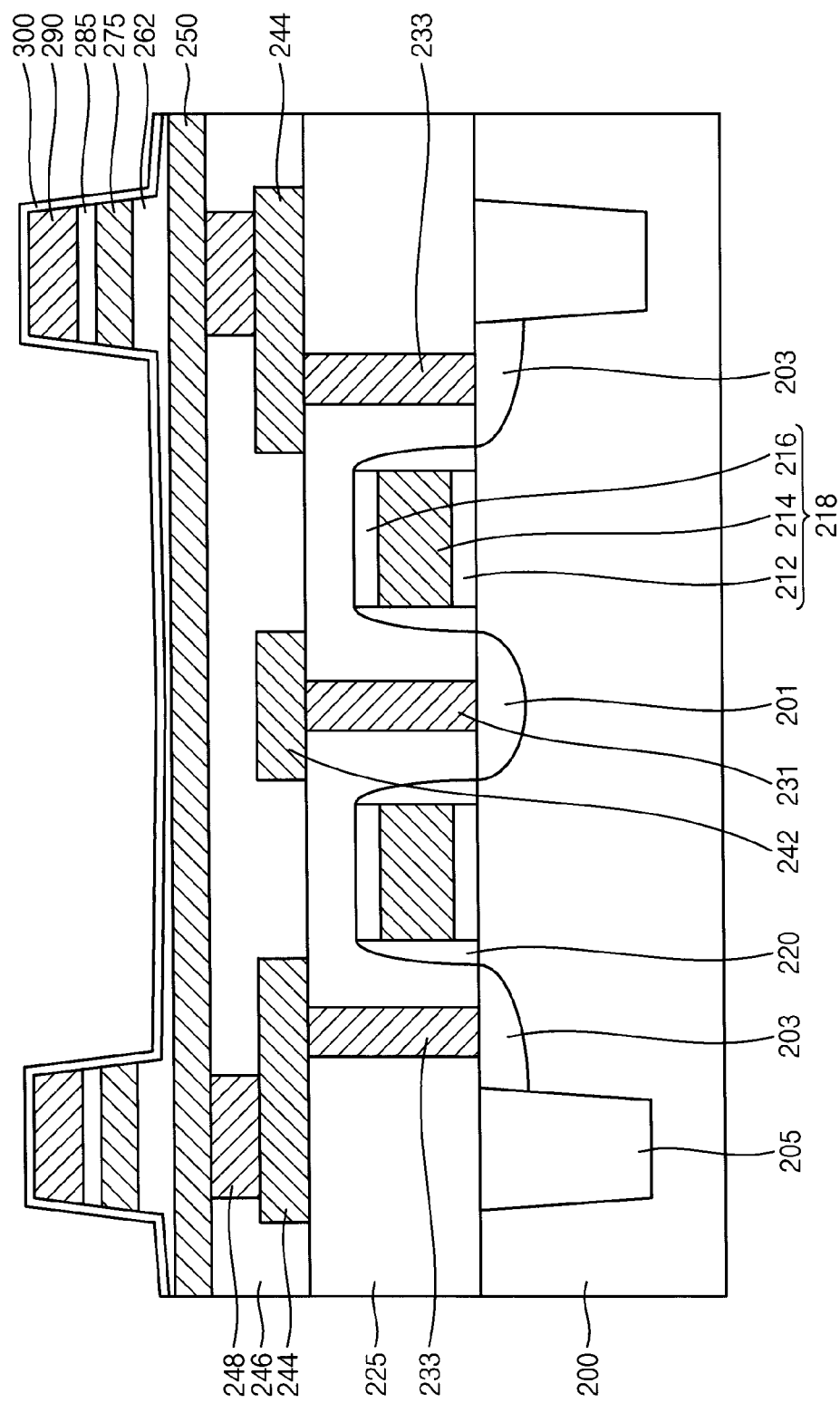

Referring to FIG. 22, a sacrificial layer 300 may be formed on the second conductive pattern 285, the second magnetic material pattern 275, and the preliminary tunnel barrier layer pattern 262. The process for forming the sacrificial layer 300 may be substantially the same as or similar to that illustrated with reference to FIG. 6.

Figure 23:
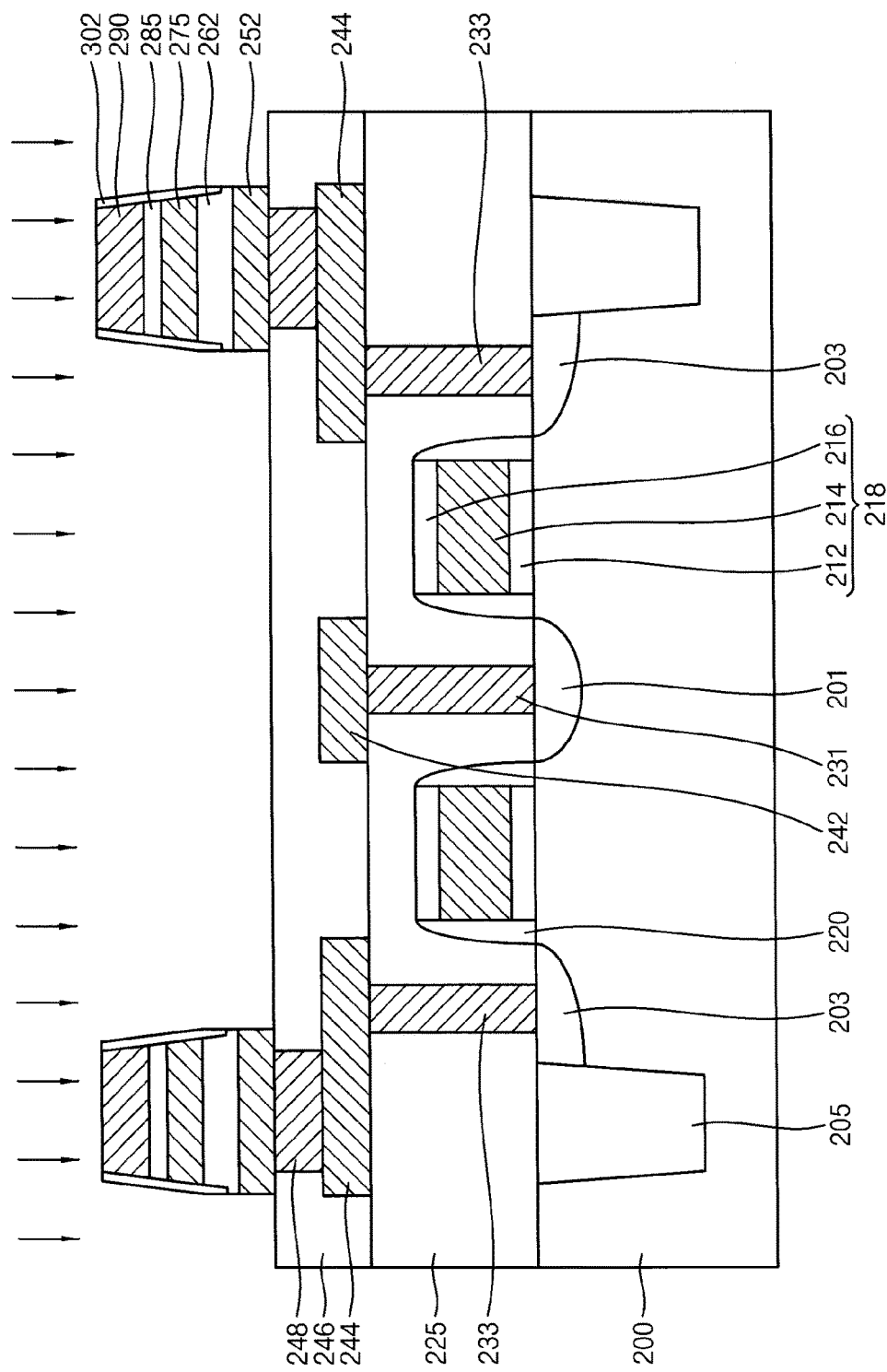

Referring to FIG. 23, the sacrificial layer 300, the preliminary tunnel barrier layer pattern 262 and the first magnetic material layer 250 may be removed partially by an etching process to form a plurality of sacrificial layer patterns 302, a plurality of preliminary tunnel barrier layer patterns 262, and a plurality of first magnetic material patterns 252, respectively. The plurality of sacrificial layer patterns 302 may be spaced apart from each other, the plurality of preliminary tunnel barrier layer patterns 262 may be spaced apart from each other, and the plurality of first magnetic material patterns 252 may be spaced from each other.

In example embodiments, the etching process may include an ion beam etching process. In the ion beam etching process, an ion beam may be accelerated in a direction substantially perpendicular to a top surface of the substrate 200.

Figure 24:
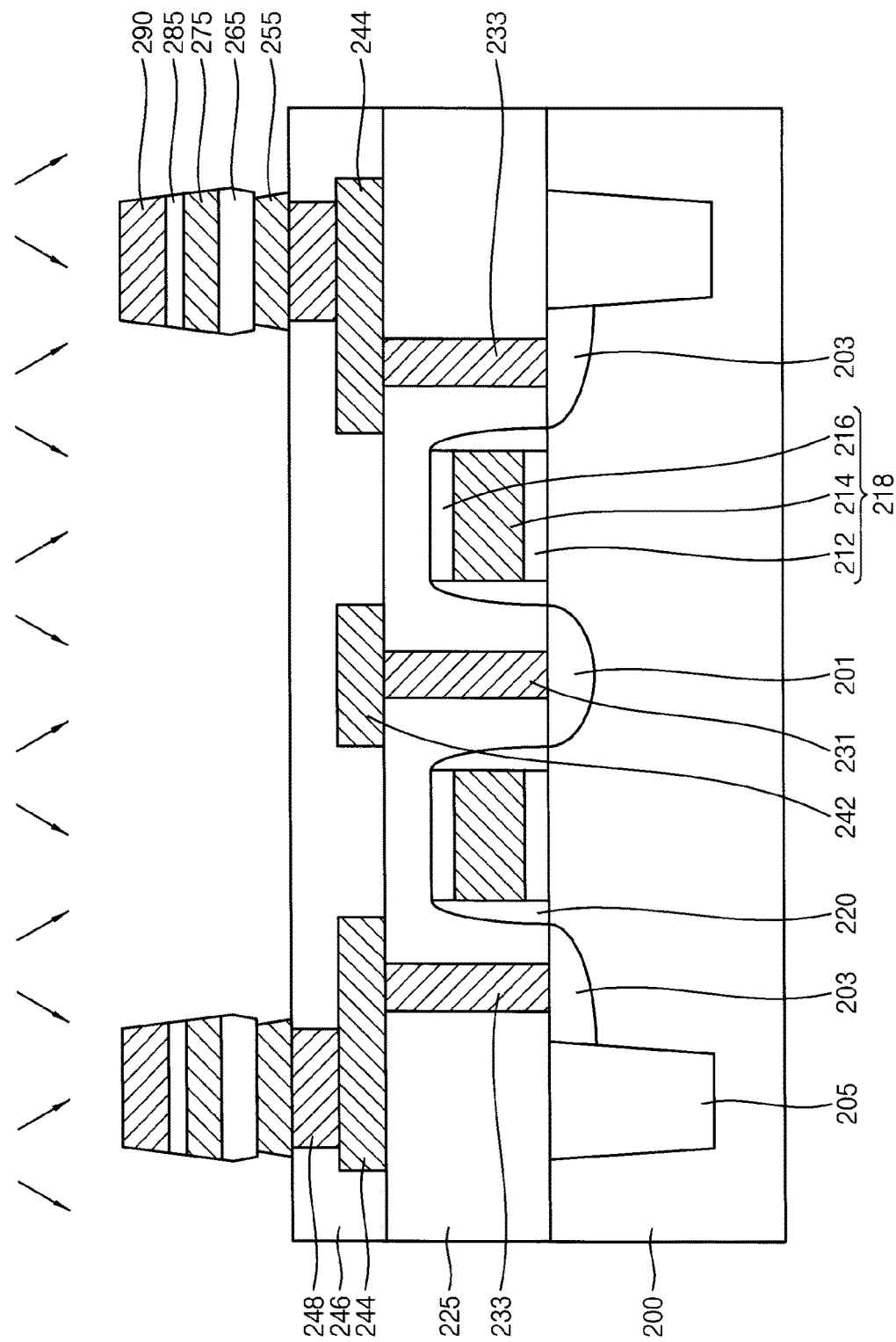

Referring to FIG. 24, the preliminary tunnel barrier layer pattern 262 and the first preliminary magnetic material pattern 252 may be removed partially by an etching process.

In example embodiments, the etching process may include an ion beam etching process. In the ion beam etching process, an ion beam may be accelerated in a direction inclined with respect to the direction substantially perpendicular to the top surface of the substrate 200.

In example embodiments, the third conductive pattern 290, the second conductive pattern 285, the second magnetic material pattern 275, and an upper portion of the preliminary barrier layer pattern 262 that may be protected by the sacrificial layer pattern 302 may not be etched. However, a lower portion of the preliminary barrier layer pattern 262 and a sidewall of the first preliminary magnetic material pattern 252 that may not be covered by the sacrificial layer pattern 302 may be etched to form a tunnel barrier layer pattern 265 and a first magnetic material pattern 255, respectively.

The lower portion of the preliminary barrier layer pattern 262 may be removed, and thus a sidewall of the tunnel barrier layer pattern 265 may be inclined by a negative slope partially or fully, which may prevent the re-deposition phenomenon.

By the above processes, the MTJ structure having the first magnetic material pattern 255, the tunnel barrier layer pattern 265, the second magnetic material pattern 275, the second conductive pattern 285, and the third conductive pattern 290 sequentially stacked may be formed.

Figure 25:
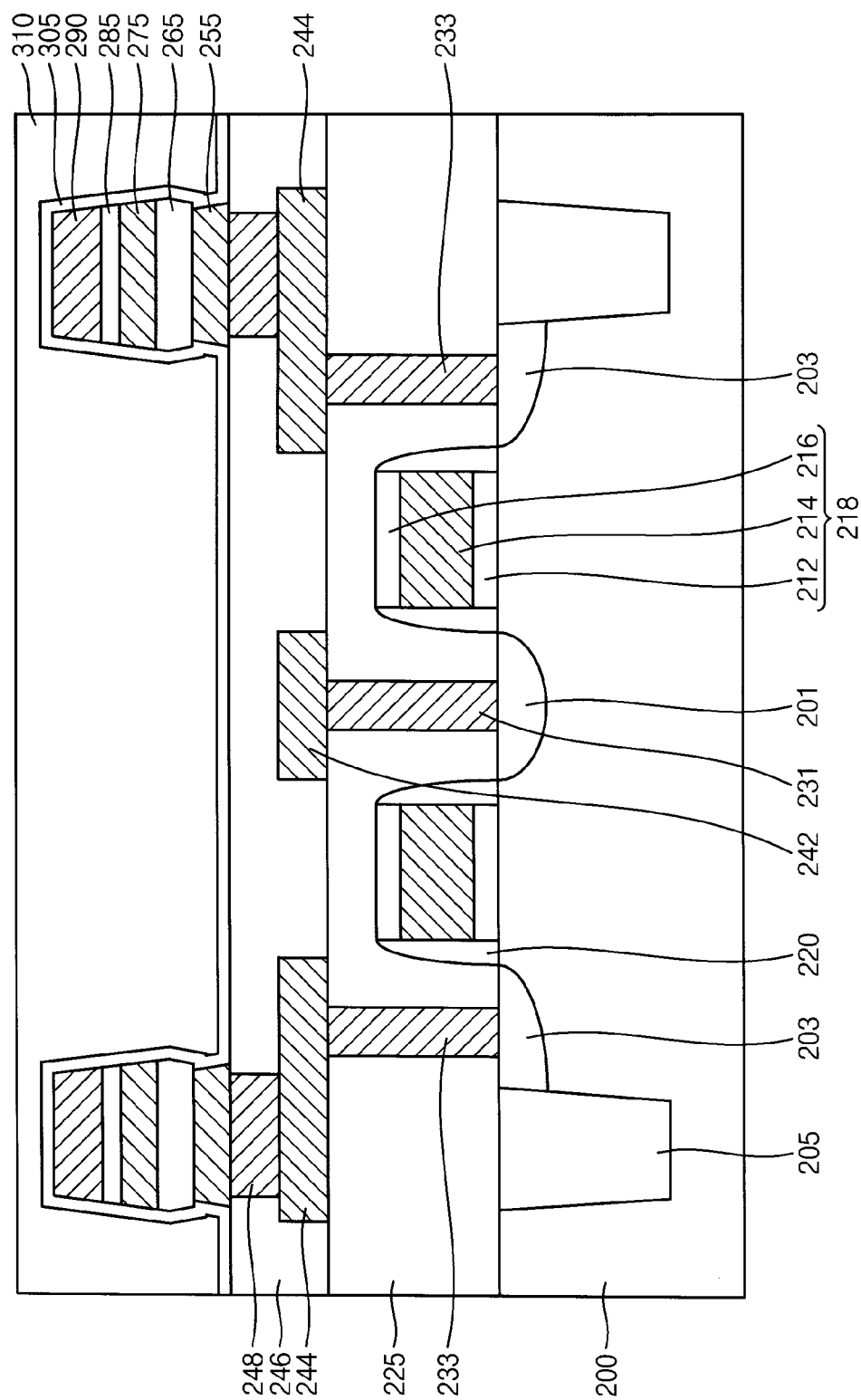

Referring to FIG. 25, a spacer layer 305 covering the MTJ structure may be formed, and a third insulating interlayer 310 may be formed on the spacer layer 305.

The spacer layer 305 may be formed to cover a top surface and a sidewall of the MTJ structure. The third insulating interlayer 310 may be formed of a material substantially the same as or similar to that of the first insulating interlayer 225, e.g., a silicon oxide.

Figure 26:
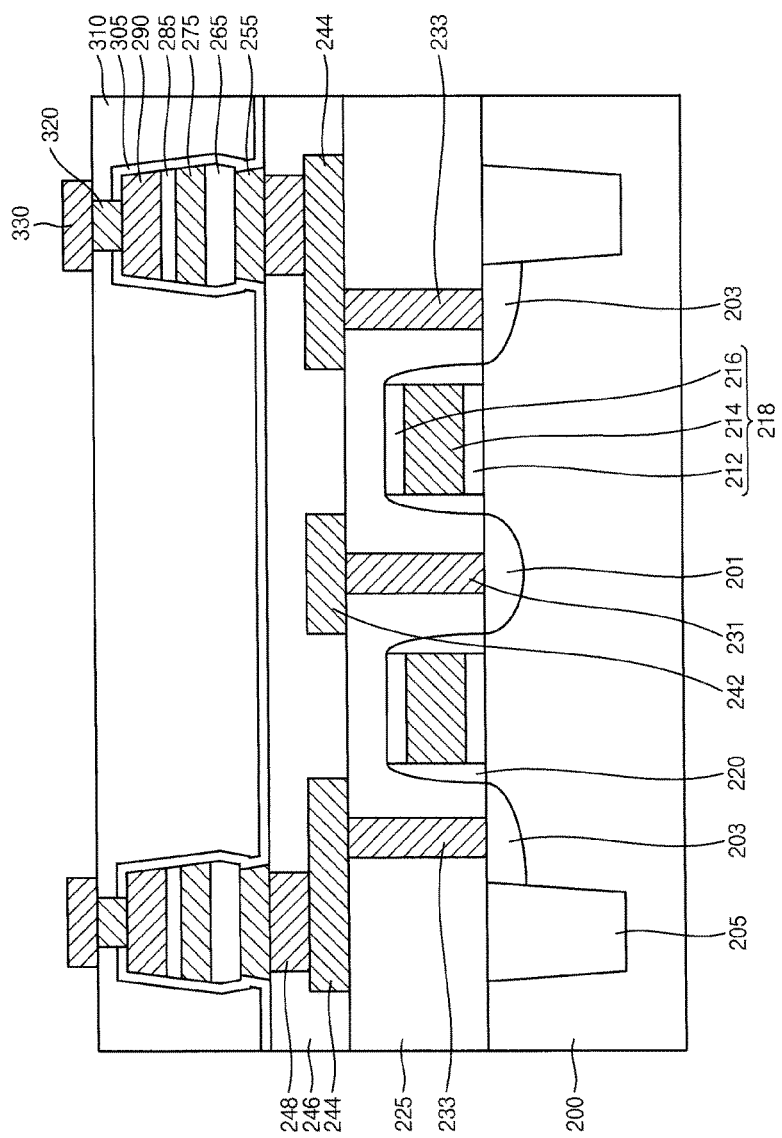

Referring to FIG. 26, a plurality of upper electrodes 320 may be formed on the MTJ structures, respectively, and a bit line 330 electrically connected to the upper electrodes 320 electrically may be formed.

The third insulating interlayer 310 and the spacer layer 305 may be removed partially to form a plurality of holes exposing the third conductive pattern 290. An upper electrode layer may be formed to sufficiently fill the holes, and an upper portion of the upper electrode layer may be planarized until a top surface of the third insulating interlayer 310 may be exposed to form the upper electrodes 320.

The upper electrode layer may be formed to include a metal, e.g., titanium, tantalum, or the like. Alternatively, the upper electrode layer may be formed to include a metal nitride, e.g., titanium nitride, tantalum nitride, or the like. The upper electrode layer may be formed by, e.g., a sputtering process, an ALD process, a CVD process, or the like.

The upper electrodes 320 have been formed after forming the third insulating interlayer 310, however, example embodiments of the present inventive concepts are not be limited thereto. For example, the upper electrodes 320 may be formed by etching an upper electrode layer, and then the third insulating interlayer 310 filling spaces between the upper electrodes 320 may be formed on the MTJ structure.

In example embodiments, each of the upper electrodes 320 may be formed to overlie the lower electrode 248. Accordingly, a memory cell may be defined by a pair of electrodes having the upper electrode 320 and the lower electrode 248 overlapping each other, and the MTJ structure between the pair of electrodes.

The bit line 330 may be formed on the third insulating interlayer 310 to be electrically connected to the upper electrodes 320. The bit line 330 may be formed to include a metal, e.g., copper, tungsten, aluminum, titanium, or the like, or metal nitride. The bit line 330 may be formed by, e.g., a sputtering process, an ALD process, or the like.

Figure 27:
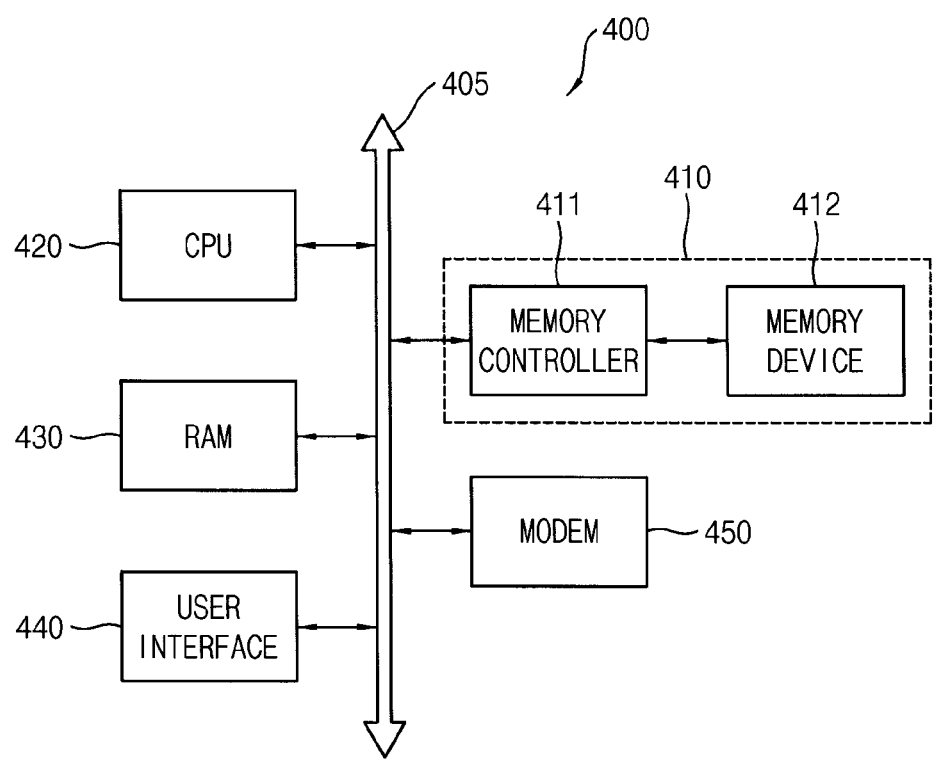

FIG. 27 is a block diagram illustrating a schematic configuration of an information processing system in accordance with example embodiments.

Referring to FIG. 27, an information processing system 400 may include a central processing unit (CPU) 420 electrically connected to a system bus 405, a random access memory (RAM) 430, a user interface 440, a modem 450, e.g., a baseband chipset, and a memory system 410. The memory system 410 may include a memory device 412 and a memory controller 411. The memory device 412 may include a MRAM device in accordance with example embodiments. Thus, the memory device 412 may reliably store data processed in the CPU 420 or high capacity data input from outside. The memory controller 411 may control the memory device 412. By combination of the memory device 412 and the memory controller 411, the memory system 410 may serve as, e.g., a memory card, a solid state disk (SSD), or the like. The memory device 412 and the memory controller 411 may serve as package-on-package (POP) form.

When the information processing system 400 is a mobile device, a battery for supplying an operating voltage of the information processing system 400 may be further provided. The information processing system 400 in accordance with example embodiments may further include an application chipset, a CMOS image sensor (CIS), mobile DRAMs, and/or the like. The information processing system 400 may be used for a mobile phone, a MP3 player, various home appliances, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments the present inventive concepts. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an MRAM device, the method comprising:
   sequentially stacking at least one first magnetic material layer, at least one tunnel barrier layer, and at least one second magnetic material layer on a substrate;
   partially removing the at least one second magnetic material layer by performing a first etching process to form at least one second magnetic material pattern;
   forming a sacrificial layer covering the at least one second magnetic material pattern and the at least one tunnel barrier layer;
   partially removing the sacrificial layer by performing a second etching process to form a sacrificial layer pattern covering a sidewall of the at least one second magnetic material pattern; and
   partially removing the at least one tunnel barrier layer and the at least one first magnetic material layer by performing a third etching process to form at least one tunnel barrier layer pattern and at least one first magnetic material pattern, respectively;

wherein each of the performing the first, second and third etching processes includes performing an ion beam etching process;

wherein the performing the second etching process includes accelerating ions in a first direction substantially perpendicular to a top surface of the substrate; and wherein the performing the third etching process includes accelerating ions in a second direction, the second direction being inclined with respect to the first direction.

2. The method of claim 1, wherein the performing the first etching process includes partially removing the at least one tunnel barrier layer to form at least one preliminary tunnel barrier layer pattern, wherein an upper portion of the at least one preliminary tunnel barrier layer pattern has a first sidewall continuous with the sidewall of the at least one second magnetic material pattern, and wherein a lower portion of the at least one preliminary tunnel barrier layer pattern has a second sidewall, the second sidewall having a slope smaller than a slope of the first sidewall of the upper portion of the at least one preliminary tunnel barrier layer pattern.

3. The method of claim 2, wherein the performing the second etching process to form the sacrificial layer pattern includes covering an upper sidewall of the at least one preliminary tunnel barrier layer pattern, and the performing the third etching process includes partially removing the lower portion of the at least one preliminary tunnel barrier pattern and the at least one first magnetic material pattern.

4. The method of claim 1, wherein the sacrificial layer has an etching rate less than an etching rate of the at least one first magnetic material layer during the second and third etching processes.

5. A method of manufacturing an MRAM device, the method comprising:

providing at least one first magnetic material pattern and at least one magnetic material layer with at least one tunnel barrier layer interposed between the at least one first magnetic material pattern and the at least one magnetic material layer;

forming a sacrificial layer pattern covering sidewalls of the at least one first magnetic material pattern; and partially removing the at least one tunnel barrier layer and the at least one magnetic material layer to form at least one tunnel barrier layer pattern and at least one second magnetic material pattern, respectively;

wherein the partially removing the at least one tunnel barrier layer includes partially removing the at least one first magnetic material pattern to form at least one third magnetic material pattern; and wherein the at least one third magnetic material pattern has first sidewalls extending in a first direction, and second sidewalls extending in a second direction, the second direction opposing the first direction.

6. The method of claim 5, wherein the forming the sacrificial layer pattern includes forming a sacrificial layer, and the sacrificial layer either (i) at least partially covers sidewalls of the at least one tunnel barrier layer, or (ii) contacts an upper surface of the at least one tunnel barrier layer.

7. The method of claim 5, wherein the partially removing the at least one tunnel barrier layer and the at least one magnetic material layer includes performing an etching process using the sacrificial layer pattern as an etching mask.

8. The method of claim 5, wherein the partially removing the at least one tunnel barrier layer includes:

forming the first sidewalls in the at least one tunnel barrier layer pattern extending in the first direction, and forming the second sidewalls in the at least one tunnel barrier layer pattern extending in the second direction opposing the first direction.

* * * * *